(12) United States Patent
Huang et al.

(10) Patent No.: US 11,417,253 B2
(45) Date of Patent: Aug. 16, 2022

(54) ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Weiyun Huang, Beijing (CN); Yue Long, Beijing (CN); Chao Zeng, Beijing (CN); Meng Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/256,669

(22) PCT Filed: Nov. 8, 2019

(86) PCT No.: PCT/CN2019/116777
§ 371 (c)(1),
(2) Date: Dec. 29, 2020

(87) PCT Pub. No.: WO2021/088001
PCT Pub. Date: May 14, 2021

(65) Prior Publication Data
US 2021/0366330 A1    Nov. 25, 2021

(51) Int. Cl.
*G09G 3/00*       (2006.01)
*G09G 3/20*       (2006.01)
*H01L 27/12*      (2006.01)

(52) U.S. Cl.
CPC .......... *G09G 3/006* (2013.01); *G09G 3/2092* (2013.01); *H01L 27/124* (2013.01)

(58) Field of Classification Search
CPC ........ G09G 3/006; G09G 3/2092; G09G 3/00; H01L 27/124
See application file for complete search history.

(56) References Cited

U.S. PATENT DOCUMENTS

2006/0050194 A1*  3/2006  Lee .................. G02F 1/1362
                                                    349/54
2017/0194402 A1*  7/2017  Choi ................ H01L 27/3276
(Continued)

FOREIGN PATENT DOCUMENTS

CN       108831362 A   * 11/2018

*Primary Examiner* — Mark W Regn
(74) *Attorney, Agent, or Firm* — Fay Sharpe LLP

(57) ABSTRACT

The present application provides an array substrate and a display device. The array substrate includes: a sub-pixel and a data line; a data signal transmission line; a test circuit, in the peripheral region and at a side, away from the display region, of the data signal transmission line, and including a first portion and a second portion, wherein the first portion and the second portion respectively comprise at least one test sub-circuit, and at least a part of the test sub-circuits are electrically connected to the data signal transmission line; a first signal access terminal group, at a side, away from the second portion, of the first portion; a second signal access terminal group, between the first portion and the second portion; and a third signal access terminal group, in the peripheral region and at a side, away from the first portion, of the second portion.

20 Claims, 17 Drawing Sheets

(56) References Cited

U.S. PATENT DOCUMENTS

2018/0076102 A1* 3/2018 Ka .................... H01L 27/3262
2019/0324096 A1* 10/2019 Osborn ................ G01R 31/44

* cited by examiner

ARRAY SUBSTRATE AND DISPLAY DEVICE

CROSS-REFERENCE TO RELATED APPLICATIONS

The present disclosure is a 371 of PCT Patent Application Serial No. PCT/CN2019/116777, filed on Nov. 8, 2019 and entitled "ARRAY SUBSTRATE AND DISPLAY DEVICE," the entire content of which is incorporated herein by reference.

TECHNICAL FIELD

The present application relates to the technical field of displays, and in particular, to an array substrate and a display device.

BACKGROUND

With the size increase of an array substrate, the length and impedance of a signal transmission line outside a display region of the array substrate also increase.

SUMMARY

An embodiment of the present application provides an array substrate and a display device, and the technical solution of the present application is as follows:

In one aspect, an array substrate is provided. The array substrate includes:

a substrate, including a display region and a peripheral region located on at least one side of the display region;

a plurality of sub-pixels, located in the display region;

a plurality of data lines, located in the display region and electrically connected to the plurality of sub-pixels;

a plurality of data signal transmission lines, located in the peripheral region and electrically connected to the plurality of data lines;

a test circuit, located in the peripheral region and at a side, away from the display region, of the plurality of data signal transmission lines, and including a first portion and a second portion which are separated, wherein the first portion and the second portion respectively include at least one test sub-circuit, and each one of at least a part of the test sub-circuits is electrically connected to at least two data signal transmission lines;

a first signal access terminal group, located in the peripheral region and at a side, away from the second portion, of the first portion;

a second signal access terminal group, located in the peripheral region and between the first portion and the second portion; and a third signal access terminal group, located in the peripheral region and at a side, away from the first portion, of the second portion;

wherein each one of the first signal access terminal group, the second signal access terminal group, and the third signal access terminal group is electrically connected to at least one of the first portion and the second portion.

Optionally, the first signal access terminal group is electrically connected to the first portion; the second signal access terminal group is respectively electrically connected to the first portion and the second portion; and the third signal access terminal group is electrically connected to the second portion.

Optionally, the array substrate further includes:

a first connecting conduction line group, a second connecting conduction line group, and a third connecting conduction line group which are located in the peripheral region;

the first signal access terminal group is electrically connected to the first portion via the first connecting conduction line group; the second signal access terminal group is electrically connected to the first portion and the second portion via the second connecting conduction line group; and the third signal access terminal group is electrically connected to the second portion via the third connecting conduction line group.

Optionally, at least one of the sub-pixels includes a thin film transistor;

the thin film transistor includes an active layer located on the substrate, a gate located at a side, away from the substrate, of the active layer, and a source and a drain which are located at a side, away from the substrate, of the gate; and the first connecting conduction line group, the second connecting conduction line group, and the third connecting conduction line group are all located in the same layer as the source.

Optionally, the first signal access terminal group, the second signal access terminal group, and the third signal access terminal group respectively include a plurality of test terminals;

the first connecting conduction line group, the second connecting conduction line group, and the third connecting conduction line group respectively include a plurality of connecting conduction lines; and the connecting conduction lines are electrically connected to the test terminals in a one-to-one correspondence.

Optionally, at least one of the test terminals includes a static electricity removal circuit and a contact pad; the static electricity removal circuit is located between the contact pad and the connecting conduction lines.

Optionally, the array substrate further includes:

a fourth signal access terminal group located in the peripheral region; the fourth signal access terminal group is located between the first portion and the second portion, and is located between the second signal access terminal group and the third signal access terminal group; and the fourth signal access terminal group is electrically connected to at least one of the first portion and the second portion.

Optionally, the first signal access terminal group and the second signal access terminal group are respectively electrically connected to the first portion; the third signal access terminal group and the fourth signal access terminal group are respectively electrically connected to the second portion.

Optionally, the array substrate further includes:

a first connecting conduction line group, a second connecting conduction line group, a third connecting conduction line group, and a fourth connecting conduction line group which are located in the peripheral region;

the first signal access terminal group is electrically connected to the first portion via the first connecting conduction line group; the second signal access terminal group is electrically connected to the first portion via the second connecting conduction line group;

the third signal access terminal group is electrically connected to the second portion via the third connecting conduction line group; and the fourth signal access terminal group is electrically connected to the second portion via the fourth connecting conduction line group.

Optionally, at least one of the sub-pixels includes a thin film transistor;

the thin film transistor includes an active layer located on the substrate, a gate located at a side, away from the substrate, of the active layer, and a source and a drain which are located at a side, away from the substrate, of the gate; and the first connecting conduction line group, the second connecting conduction line group, the third connecting conduction line group, and the fourth connecting conduction line group are all located in the same layer as the source.

Optionally, the array substrate further includes:

a bridging conduction line group connecting the first portion to the second portion; the bridging conduction line group is located in the peripheral region, and includes a plurality of bridging conduction lines; at least one bridging conduction line includes a first conduction line section, a second conduction line section, and a bridging section connecting the first conduction line section to the second conduction line section;

the first conduction line section is located adjacent to the first portion; the second conduction line section is located adjacent to the second portion; and the bridging section is located in a region between the first portion and the second portion.

optionally, at least one of the sub-pixels includes a thin film transistor and a storage capacitor;

the thin film transistor includes an active layer located on the substrate, a gate located at a side, away from the substrate, of the active layer, a first insulating layer located at a side, away from the substrate, of the gate, a second insulating layer located at a side, away from the substrate, of the first insulating layer, and a source and a drain which are located at a side, away from the substrate, of the second insulating layer;

the storage capacitor includes a first polar plate and a second polar plate; the first polar plate is located in the same layer as the gate; the second polar plate is located between the first insulating layer and the second insulating layer;

the first conduction line section includes a first sub-layer of the first conduction line section, and a second sub-layer of the first conduction line section; the second conduction line section includes a first sub-layer of the second conduction line section and a second sub-layer of the second conduction line section; the bridging section, the first sub-layer of the first conduction line section, and the first sub-layer of the second conduction line section are located in the same layer as the gate; the second sub-layer of the first conduction line section, and the second sub-layer of the second conduction line section are located in the same layer as the second polar plate; the first sub-layer of the first conduction line section and the second sub-layer of the first conduction line section are electrically connected via a first conduction line through-hole; and the first sub-layer of the second conduction line section and the second sub-layer of second conduction line section are electrically connected via a second conduction line through-hole.

Optionally, the first signal access terminal group, the second signal access terminal group, the third signal access terminal group, and the fourth signal access terminal group respectively include a plurality of test terminals;

the first connecting conduction line group, the second connecting conduction line group, the third connecting conduction line group, and the fourth connecting conduction line group respectively include a plurality of connecting conduction lines; and the connecting conduction lines are electrically connected to the test terminals in a one-to-one correspondence.

Optionally, at least one of the test terminals includes a static electricity removal circuit and a contact pad; the static electricity removal circuit is located between the contact pad and the connecting conduction lines.

Optionally, the first portion includes a first effective test sub-circuit and a first redundant test sub-circuit; the second portion includes a second effective test sub-circuit and a second redundant test sub-circuit;

the first effective test sub-circuit is located between the first redundant test sub-circuit and the second portion; and the second effective test sub-circuit is located between the second redundant test sub-circuit and the first portion.

Optionally, each first effective test sub-circuit is electrically connected to two data signal transmission lines; and each second effective test sub-circuit is electrically connected two data signal transmission lines.

Optionally, the test sub-circuit includes a first multiplexed switch, a second multiplexed switch, a third multiplexed switch, a first connecting portion, and a second connecting portion; the second multiplexed switch and the third multiplexed switch are respectively located at a side, away from the display region, of the first multiplexed switch;

the plurality of sub-pixels include a plurality of first sub-pixels, a plurality of second sub-pixels, and a plurality of third sub-pixels;

the first multiplexed switch is located at a side, away from the display region, of the plurality of data signal transmission lines; the first multiplexed switch is respectively electrically connected to the first connecting portion and the second connecting portion, and is used to transmit a data signal of one first sub-pixel to the data signal transmission lines via the first connecting portion and the second connecting portion in different time periods, and transmit, via the data signal transmission lines, the data signal to other first sub-pixels electrically connected to different data lines;

the second multiplexed switch is electrically connected to the first connecting portion, and is used to transmit a data signal of one second sub-pixel or a data signal of one third sub-pixel to the data signal transmission lines via the first connecting portion in different time periods, and transmit, via the data signal transmission lines, the data signal to other second sub-pixels or other third sub-pixels electrically connected to the same data lines; and the third multiplexed switch is electrically connected to the second connecting portion, and is used to transmit a data signal of one second sub-pixel or a data signal of one third sub-pixel to the data signal transmission lines via the second connecting portion in different time periods, and transmit, via the data signal transmission lines, the data signal to other second sub-pixels or other third sub-pixels electrically connected to the same data lines.

Optionally, the first multiplexed switch includes:

an active layer of the first multiplexed switch located on the substrate;

a first gate of the first multiplexed switch and a second gate of the first multiplexed switch which are located at a side, away from the substrate, of the active layer of the first multiplexed switch, an orthographic projection of the first gate of the first multiplexed switch on the substrate staggering from an orthographic projection of the second gate of the first multiplexed switch on the substrate;

a source of the first multiplexed switch, a first drain of the first multiplexed switch, and a second drain of the first multiplexed switch which are located at a side, away from the substrate, of the first gate of the first multiplexed switch and the second gate of the first multiplexed switch, wherein the source of the first multiplexed switch is located between the first drain of the first multiplexed switch and the second drain of the first multiplexed switch;

the orthographic projection of the first gate of the first multiplexed switch on the substrate falls between orthographic projections of the first drain of the first multiplexed switch and the source of the first multiplexed switch on the substrate; and the orthographic projection of the second gate of the first multiplexed switch on the substrate falls between orthographic projections of the second drain of the first multiplexed switch and the source of the first multiplexed switch on the substrate.

Optionally, the second multiplexed includes:

an active layer of the second multiplexed switch located on the substrate;

a first gate of the second multiplexed switch and a second gate of the second multiplexed switch which are located at a side, away from the substrate, of the active layer of the second multiplexed switch, an orthographic projection of the first gate of the second multiplexed switch on the substrate staggering from an orthographic projection of the second gate of the second multiplexed switch on the substrate;

a first source of the second multiplexed switch, a drain of the second multiplexed switch, and a second source of the second multiplexed switch which are located at a side, away from the substrate, of the first gate of the second multiplexed switch and the second gate of the second multiplexed switch, wherein the drain of the second multiplexed switch is located between the first source of the second multiplexed switch and the second source of the second multiplexed switch;

the orthographic projection of the first gate of the second multiplexed switch on the substrate falls between orthographic projections of the first source of the second multiplexed switch and the drain of the second multiplexed switch on the substrate; and the orthographic projection of the second gate of the second multiplexed switch on the substrate falls between orthographic projections of the drain of the second multiplexed switch and the second source of the second multiplexed switch on the substrate.

Optionally, the third multiplexed switch includes:

an active layer of the third multiplexed switch located on the substrate;

a first gate of the third multiplexed switch and a second gate of the third multiplexed switch which are located at a side, away from the substrate, of the active layer of the third multiplexed switch, an orthographic projection of the first gate of the third multiplexed switch on the substrate staggering from an orthographic projection of the second gate of the third multiplexed switch on the substrate;

a first source of the third multiplexed switch, a drain of the third multiplexed switch, and a second source of the third multiplexed switch which are located at a side, away from the substrate, of the first gate of the third multiplexed switch and the second gate of the third multiplexed switch, wherein the drain of the third multiplexed switch is located between the first source of the third multiplexed switch and the second source of the third multiplexed switch;

the orthographic projection of the first gate of the third multiplexed switch on the substrate falls between orthographic projections of the first source of the third multiplexed switch and the drain of the third multiplexed switch on the substrate; and the orthographic projection of the second gate of the third multiplexed switch on the substrate falls between orthographic projections of the drain of the third multiplexed switch and the second source of the third multiplexed switch on the substrate.

Optionally, the array substrate further includes:

a plurality of test control lines arranged in parallel, and located in the peripheral region and at a side, away from the display region, of the second multiplexed switch and the third multiplexed switch; the plurality of test control lines include a first sub-pixel gate control line, a second sub-pixel gate control line, a third sub-pixel gate control line, a first sub-pixel data control line, a second sub-pixel data control line, and a third sub-pixel data control line;

the first sub-pixel gate control line is electrically connected to the first gate of the first multiplexed switch and the second gate of the first multiplexed switch; the second sub-pixel gate control line is electrically connected to the second gate of the second multiplexed switch and the second gate of the third multiplexed switch; the third sub-pixel gate control line is electrically connected to the first gate of the second multiplexed switch and the first gate of the third multiplexed switch; the first sub-pixel data control line is electrically connected to the source of the first multiplexed switch; the second sub-pixel data control line is respectively electrically connected to the first source of the second multiplexed switch and the second source of the third multiplexed switch; and the third sub-pixel data control line is respectively electrically connected to the second source of the second multiplexed switch and the first source of the third multiplexed switch.

Optionally, the first sub-pixel gate control line includes a first sub-layer of the first sub-pixel gate control line and a second sub-layer of the first sub-pixel gate control line; the second sub-pixel gate control line includes a first sub-layer of the second sub-pixel gate control line and a second sub-layer of the second sub-pixel gate control line; and the third sub-pixel gate control line includes a first sub-layer of the third sub-pixel gate control line and a second sub-layer of the third sub-pixel gate control line;

the first sub-pixel data control line includes a first sub-layer of the first sub-pixel data control line and a second sub-layer of the first sub-pixel data control line; the second sub-pixel data control line includes a first sub-layer of the second sub-pixel data control line and a second sub-layer of the second sub-pixel data control line; and the third sub-pixel data control line includes a first sub-layer of the third sub-pixel data control line and a second sub-layer of the third sub-pixel data control line;

the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are located in the same layer; the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are located in the same layer; furthermore, the layer that the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are located is different from the layer that the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are located;

the first sub-layer of the first sub-pixel gate control line and the second sub-layer of the first sub-pixel gate control line are electrically connected via a gate through-hole of the first sub-pixel; the first sub-layer of the second sub-pixel gate control line and the second sub-layer of the second sub-pixel gate control line are electrically connected via a gate through-hole of the second sub-pixel; and the first sub-layer of the third sub-pixel gate control line and the second sub-layer of the third sub-pixel gate control line are electrically connected via a gate through-hole of the third sub-pixel;

the first sub-layer of the first sub-pixel data control line and the second sub-layer of the first sub-pixel data control line are electrically connected via a data through-hole of the first sub-pixel; the first sub-layer of the second sub-pixel data control line and the second sub-layer of the second sub-pixel data control line are electrically connected via a data through-hole of the second sub-pixel; and the first sub-layer of the third sub-pixel data control line and the second sub-layer of the third sub-pixel data control line are electrically connected via a data through-hole of the third sub-pixel.

Optionally, at least one of the sub-pixels includes a thin film transistor and a connecting electrode;

the thin film transistor includes an active layer located on the substrate, a gate located at a side, away from the substrate, of the active layer, and a source and a drain which are located at a side, away from the substrate, of the gate; and the connecting electrode is located at a side, away from the substrate, of the source;

the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are located in the same layer as the source;

the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are located in the same layer as the connecting electrode.

Optionally, the first connecting portion and the second connecting portion are located in the same layer as the source.

Optionally, the array substrate further includes: a plurality of data signal input lines, located in the peripheral region; the plurality of data signal input lines are respectively electrically connected to the first connecting portion and the second connecting portion via the second multiplexed switch and the third multiplexed switch.

Optionally, the array substrate further includes: a plurality of signal input terminals, located in the peripheral region and at a side, away from the display region, of the plurality of data signal input lines; the plurality of signal input terminals are electrically connected to the plurality of data signal input lines in a one-to-one correspondence.

Optionally, the plurality of data signal input lines includes first data signal input lines and second data signal input lines which are alternately arranged;

at least one of the sub-pixels includes a thin film transistor and a storage capacitor;

the thin film transistor includes an active layer located on the substrate, a gate located at a side, away from the substrate, of the active layer, a first insulating layer located at a side, away from the substrate, of the gate, a second insulating layer located at a side, away from the substrate, of the first insulating layer, and a source and a drain which are located at a side, away from the substrate, of the second insulating layer;

the storage capacitor includes a first polar plate and a second polar plate; the first polar plate is located in the same layer as the gate; the second polar plate is located between the first insulating layer and the second insulating layer;

the first data signal input lines are located in the same layer as the gate; and the second data signal input lines are located in the same layer as the second polar plate.

Optionally, the array substrate further includes: a source through-hole of the first multiplexed switch, located in the peripheral region; the first connecting portion and the second connecting portion are electrically connected to the active layer of the first multiplexed switch via the source through-hole of the first multiplexed switch.

Optionally, the array substrate further includes: a drain through-hole of second multiplexed switch, located in the peripheral region; the first connecting portion is electrically connected to the active layer of the second multiplexed switch via the drain through-hole of the second multiplexed switch.

Optionally, the array substrate further includes: a drain through hole of the third multiplexed switch, located in the peripheral region; the second connecting portion are electrically connected to the active layer of the third multiplexed switch via the drain through hole of the third multiplexed switch.

Optionally, the plurality of data signal transmission lines include a first data signal transmission line and a second data signal transmission line which are alternately arranged;

at least one of the sub-pixels includes a thin film transistor and a storage capacitor;

the thin film transistor includes an active layer located on the substrate, a gate located at a side, away from the substrate, of the active layer, a first insulating layer located at a side, away from the substrate, of the gate, a second insulating layer located at a side, away from the substrate, of the first insulating layer, and a source and a drain which are located at a side, away from the substrate, of the second insulating layer;

the storage capacitor includes a first polar plate and a second polar plate; the first polar plate is located in the same layer as the gate; the second polar plate is located between the first insulating layer and the second insulating layer;

the first data signal transmission lines are located in the same layer as the gate; and the second data signal transmission lines are located in the same layer as the second polar plate.

In another aspect, a display device is provided. The display device includes any one array substrate described in the above aspect.

DETAILED DESCRIPTION

To make the principles, technical solutions, and advantages of the present application clearer, the implementation manners of the present application are described below in detail with reference to the accompanying drawings.

In related arts, when the impedance of the signal transmission line for transmitting a test signal is too high, a picture displayed by the array substrate on the basis of the test signal would be abnormal, such that the picture detection cannot be normally performed.

Figure 1:
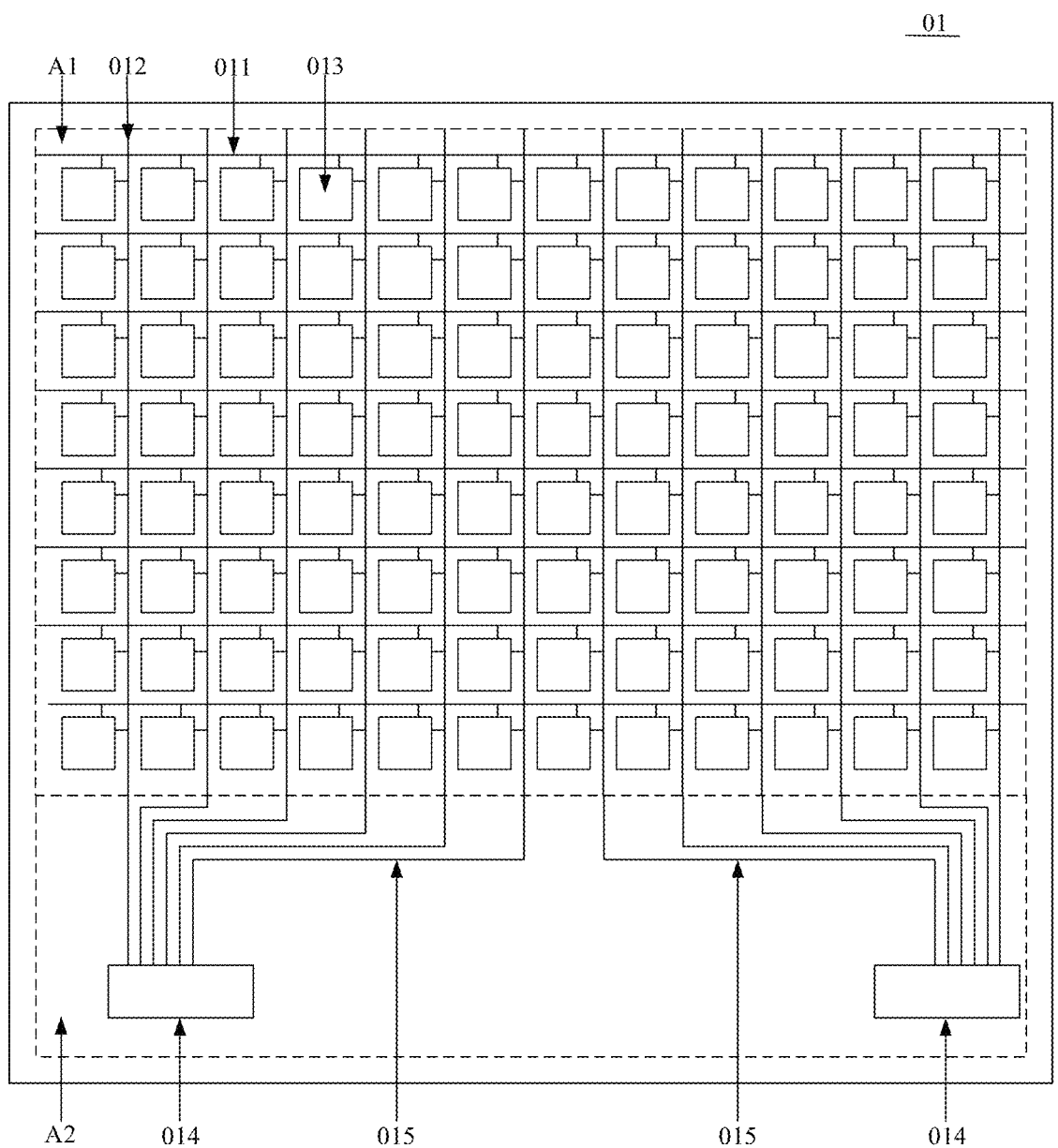
FIG. 1 is a schematic structural diagram of an array substrate involved in an embodiment of the present application.

FIG. 1 shows a front view of an array substrate 01 involved in an embodiment of the present application. With reference to FIG. 1, the array substrate 01 includes a plurality of gate lines 011, a plurality of data lines 012 and a plurality of sub-pixels 013 which are located in a display region A1, and two signal access terminal groups 014 and a plurality of data signal transmission lines 015 which are located in a peripheral region A2, wherein the plurality of gate lines 011 and the plurality of data lines 012 crosswise define a plurality of pixel regions; the gate lines 011 and the data lines 012 are respectively electrically connected to the sub-pixels 013. The two signal access terminal groups 014 are generally located in the peripheral region A2, and are located adjacent to an edge of the array substrate 01 (for example, the left and right sides of a put position as shown in FIG. 1); and each signal access terminal group 014 is electrically connected to the plurality of data lines 012 via the plurality of data signal transmission lines 015. At a test stage of a display device, each signal access terminal group 014 can apply, via the data signal transmission lines 015 electrically connected thereto, a test signal to the data lines 012 electrically connected to the data signal transmission line 015, and the cooperates with other signal lines (for example, a power signal line which is not shown in the figure) to detect whether the display device can normally display a picture.

It can be seen from FIG. 1 that the farther the data line 012 to the signal access terminal group 014 is, the longer the data signal transmission line 015 connected to the data line 012 would be; therefore, it would be easy to understand that the farther the data line 012 to the signal access terminal group 014 is, the higher the impedance of the data signal transmission line 015 connected to the data line 012 would be, and the more serious the IR drop and signal delay of the data signal transmission line 015 connected to the data line 012 would be. In the array substrate as shown in FIG. 1, the test signals received by different data lines 012 have different delays; the closer the data line 012 to a central region is, the greater the delay of the test signal received by the data line 012 is; when the delays of the test signals received by different data lines 012 are too different, a test picture displayed by the display device on the basis of the test signals received by different data lines 012 would be abnormal, such that picture detection cannot be normally performed. Illustratively, when the signal access terminal group 014 applies, via the data signal transmission lines 015, to the data lines 012 a 60 Hz test signal for switching a color of the test picture with time, different data signal transmission lines 015 have different delays for the test signal; therefore, in the test picture displayed by the display device, the color change in the central region obviously lags behind the color changes of the regions on the two sides (for example, the left and right sides of the put position as shown in FIG. 1), and the test picture would have a mixed color, such that the picture detection cannot be normally performed.

In the embodiment of the present application, a signal access terminal group is added between the two signal access terminal groups 014, and a test signal is applied to the data lines 012 farther from the signal access terminal groups 014 via the added signal access terminal group; therefore, the present application can reduce the lengths of the data signal transmission lines electrically connected to the data lines 012 farther from the signal access terminal groups 014, such that the impedances thereof can be reduce, and the differences of the test signals received by different data lines can be reduced, thus ensuring that the picture detection can be normally performed. For detailed solutions of the present application, please refer to the following embodiments.

The present application provides an array substrate, including:

a substrate, including a display region and a peripheral region located on at least one side of the display region;

a plurality of sub-pixels, located in the display region;

a plurality of data lines, located in the display region and electrically connected to the plurality of sub-pixels;

a plurality of data signal transmission lines, located in the peripheral region and electrically connected to the plurality of data lines;

a test circuit, located in the peripheral region and at a side, away from the display region, of the plurality of data signal transmission lines, and including a first portion and a second portion which are separated, wherein the first portion and the second portion respectively include at least one test sub-circuit, and each one of at least a part of the test sub-circuits is electrically connected to at least two data signal transmission lines;

a first signal access terminal group, located in the peripheral region and at a side, away from the second portion, of the first portion;

a second signal access terminal group, located in the peripheral region and between the first portion and the second portion; and a third signal access terminal group, located in the peripheral region and at a side, away from the first portion, of the second portion;

wherein each one of the first signal access terminal group, the second signal access terminal group, and the third signal access terminal group is electrically connected to at least one of the first portion and the second portion.

Optionally, the first signal access terminal group is electrically connected to the first portion; the second signal access terminal group is respectively electrically connected to the first portion and the second portion; and the third signal access terminal group is electrically connected to the second portion.

Optionally, the array substrate further includes: a first connecting conduction line group, a second connecting conduction line group, and a third connecting conduction line group which are located in the peripheral region;

the first signal access terminal group is electrically connected to the first portion via the first connecting conduction line group; the second signal access terminal group is electrically connected to the first portion and the second portion via the second connecting conduction line group; and the third signal access terminal group is electrically connected to the second portion via the third connecting conduction line group.

Optionally, at least one of the sub-pixels includes a thin film transistor;

the thin film transistor includes an active layer located on the substrate, a gate located at a side, away from the substrate, of the active layer, and a source and a drain which are located at a side, away from the substrate, of the gate; and the first connecting conduction line group, the second connecting conduction line group, and the third connecting conduction line group are all located in the same layer as the source.

Optionally, the first signal access terminal group, the second signal access terminal group, and the third signal access terminal group respectively include a plurality of test terminals;

the first connecting conduction line group, the second connecting conduction line group, and the third connecting conduction line group respectively include a plurality of connecting conduction lines; and the connecting conduction lines are electrically connected to the test terminals in a one-to-one correspondence.

Optionally, at least one of the test terminals includes a static electricity removal circuit and a contact pad; the static electricity removal circuit is located between the contact pad and the connecting conduction lines.

Figure 2:
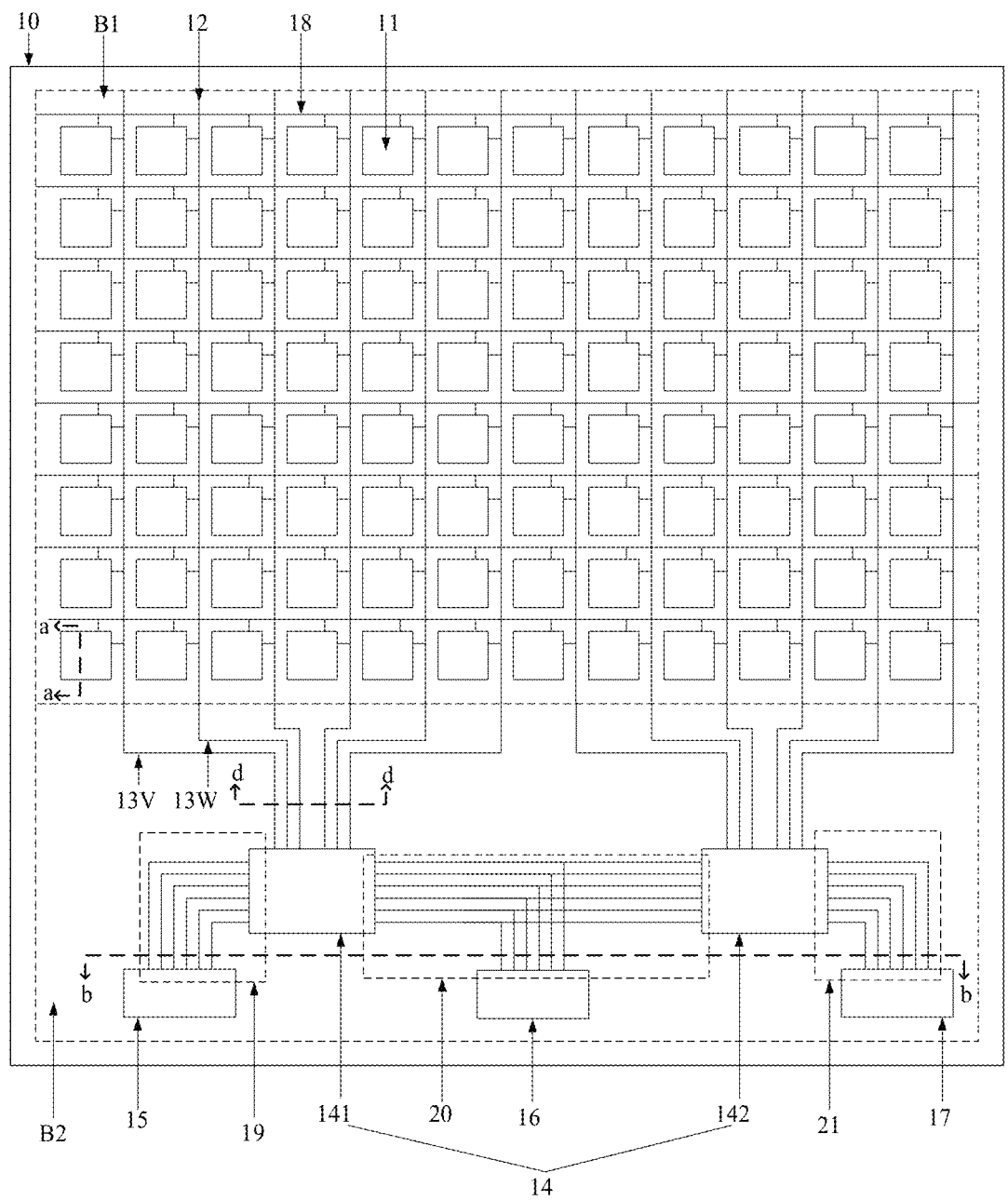
FIG. 2 is a schematic structural diagram of an array substrate provided by an embodiment of the present application.

Illustratively, FIG. 2 is a schematic structural diagram of an array substrate provided by an embodiment of the present application. With reference to FIG. 2, the array substrate includes:

a substrate 10, including a display region B1 and a peripheral region B2 located on at least one side of the display region B1;

a plurality of sub-pixels 11, located in the display region B1;

a plurality of data lines 12, located in the display region B1 and electrically connected to the plurality of sub-pixels 11;

a plurality of data signal transmission lines, located in the peripheral region B2 and electrically connected to the plurality of data lines 12, wherein the plurality of data signal transmission lines includes first data signal transmission lines 13V and second data signal transmission lines 13W which are alternately arranged; the first data signal transmission lines 13V and the second data signal transmission lines 13W can be arranged alternately one by one, or multiple by multiple; for example, two first data signal transmission lines 13V and two second data signal transmission lines 13W are arranged alternately (that is, two second data signal transmission lines 13W are arranged every two first data signal transmission lines 13V, and two first data signal transmission lines 13V are arranged every two second data signal transmission lines 13W); alternatively, one first data signal transmission line 13V and two second data signal transmission lines 13W are arranged alternately (that is, two second data signal transmission lines 13W are arranged every one first data signal transmission line 13V, and one first data signal transmission line 13V is arranged every two second data signal transmission lines 13W); and as shown in FIG. 2, the embodiment of the present application performs description by taking the situation that the first data signal transmission lines 13V and the second data signal transmission lines 13W are arranged alternately one by one as an example;

a test circuit 14, located in the peripheral region B2 and at a side, away from the display region B1, of the plurality of data signal transmission lines 13, and including a first portion 141 and a second portion 142 which are separated, wherein the first portion 141 and the second portion 142 respectively include at least one test sub-circuit (not shown in FIG. 2), and each one of at least a part of the test sub-circuits is electrically connected to at least two data signal transmission lines;

a first signal access terminal group 15, located in the peripheral region B2 and at a side, away from the second portion 142, of the first portion 141;

a second signal access terminal group 16, located in the peripheral region B2 and between the first portion 141 and the second portion 142; and a third signal access terminal group 17, located in the peripheral region B2 and at a side, away from the first portion 141, of the second portion 142, wherein each one of the first signal access terminal group 15, the second signal access terminal group 16, and the third signal access terminal group 17 is electrically connected to at least one of the first portion 141 and the second portion 142.

Optionally, as shown in FIG. 2, the array substrate further includes a plurality of gate lines 18 located in the display region B1; the plurality of gate lines 18 and the plurality of data lines 12 crosswise define a plurality of pixel regions; the plurality of sub-pixels 11 are located in the plurality of pixel regions, and are electrically connected to the plurality of gate lines 18 and the plurality of data lines 12; for example, the plurality of sub-pixels 11 are located in the plurality of pixel regions in a one-to-one correspondence; each gate line 18 is electrically connected to a row of sub-pixels 11; and each data line 12 is electrically connected to a column of sub-pixels 11.

Figure 3:
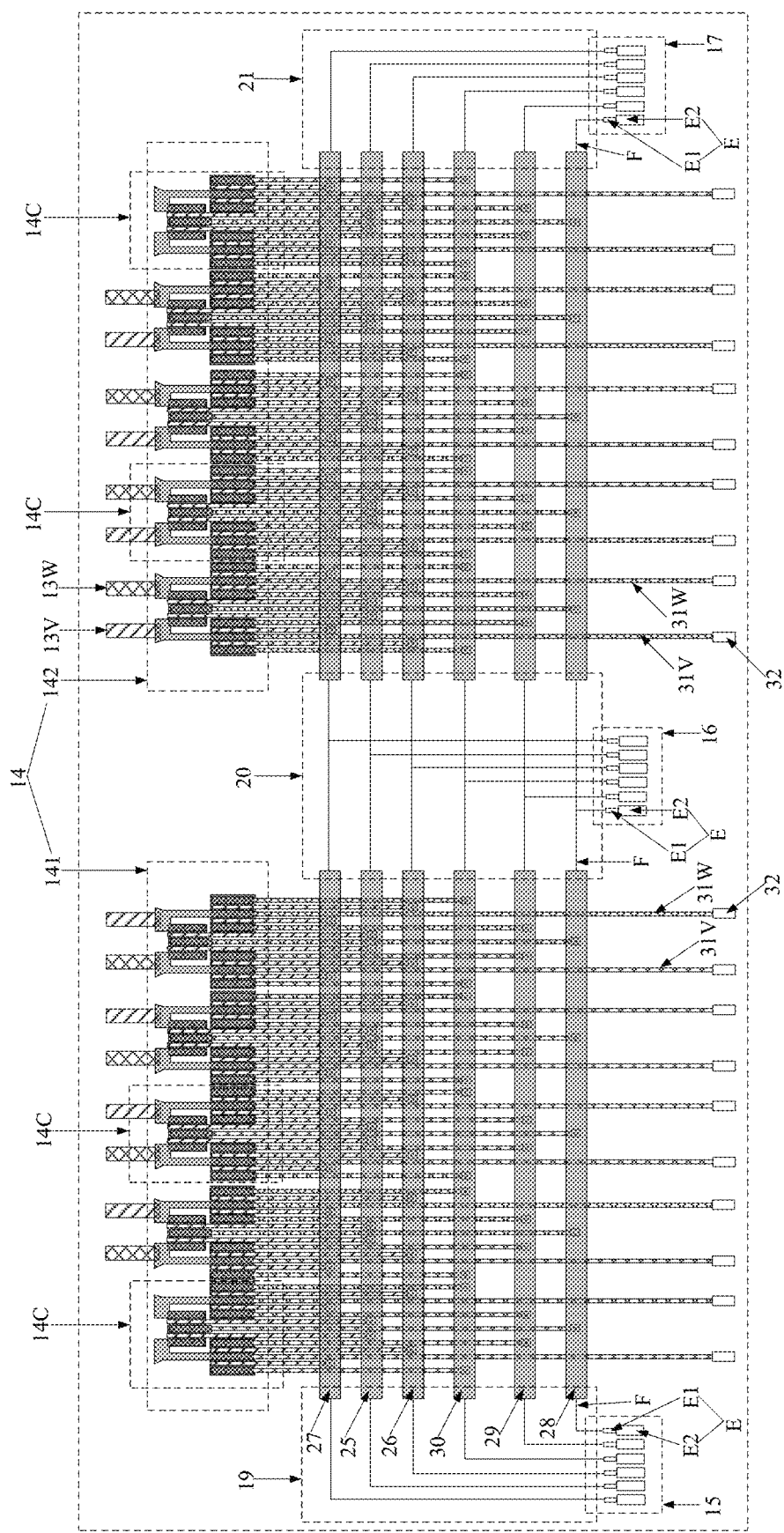
FIG. 3 is an enlarged view of a peripheral region of the array substrate as shown in FIG. 2.

Optionally, FIG. 3 shows an enlarged view of the peripheral region B2 of the array substrate as shown in FIG. 2. With reference to FIG. 3, the test circuit 14 includes a first portion 141 and a second portion 142 which are separated, wherein the first portion 141 and the second portion 142 respectively include at least one test sub-circuit, and each test sub-circuits 14C of at least a part of the test sub-circuits 14C is electrically connected to at least two data signal transmission lines.

Optionally, the first signal access terminal group 15 is electrically connected to the first portion 141; the second signal access terminal group 16 is respectively electrically connected to the first portion 141 and the second portion 142; and the third signal access terminal group 17 is electrically connected to the second portion 142. As shown in FIGS. 2 and 3, the array substrate further includes a first connecting conduction line group 19, a second connecting conduction line group 20 and a third connecting conduction line group 21 which are located in the peripheral region B2, wherein the first signal access terminal group 15 is electrically connected to the first portion 141 via the first connecting conduction line group 19; the second signal access terminal group 16 is electrically connected to the first portion 141 and the second portion 142 via the second connecting conduction line group 16; and the third signal access terminal group 17 is electrically connected to the second portion 142 via the third connecting conduction line group 21.

Optionally, as shown in FIG. 3, the first signal access terminal group 15, the second signal access terminal group 16 and the third signal access terminal group 17 respectively include a plurality of test terminals E; the first connecting conduction line group 19, the second connecting conduction line group 20, and the third connecting conduction line group 21 respectively include a plurality of connecting conduction lines F; and the connecting conduction lines F are electrically connected to the test terminals E in a one-to-one correspondence. Optionally, at least one of the test terminals E includes a static electricity removal circuit E1 and a contact pad E2, wherein the static electricity removal circuit E1 is located between the contact pad E2 and the connecting conduction lines F. The static electricity removal circuit E1 may be used to remove static electricity, thus avoiding the static electricity from damaging the test terminals E, avoiding the static electricity from being led to the test circuit 14 from the test terminals E and damaging the test circuit 14, and can avoiding the static electricity from being led to the display region B1 of the array substrate from the test circuit 14 and damaging the sub-pixels.

Figure 4:
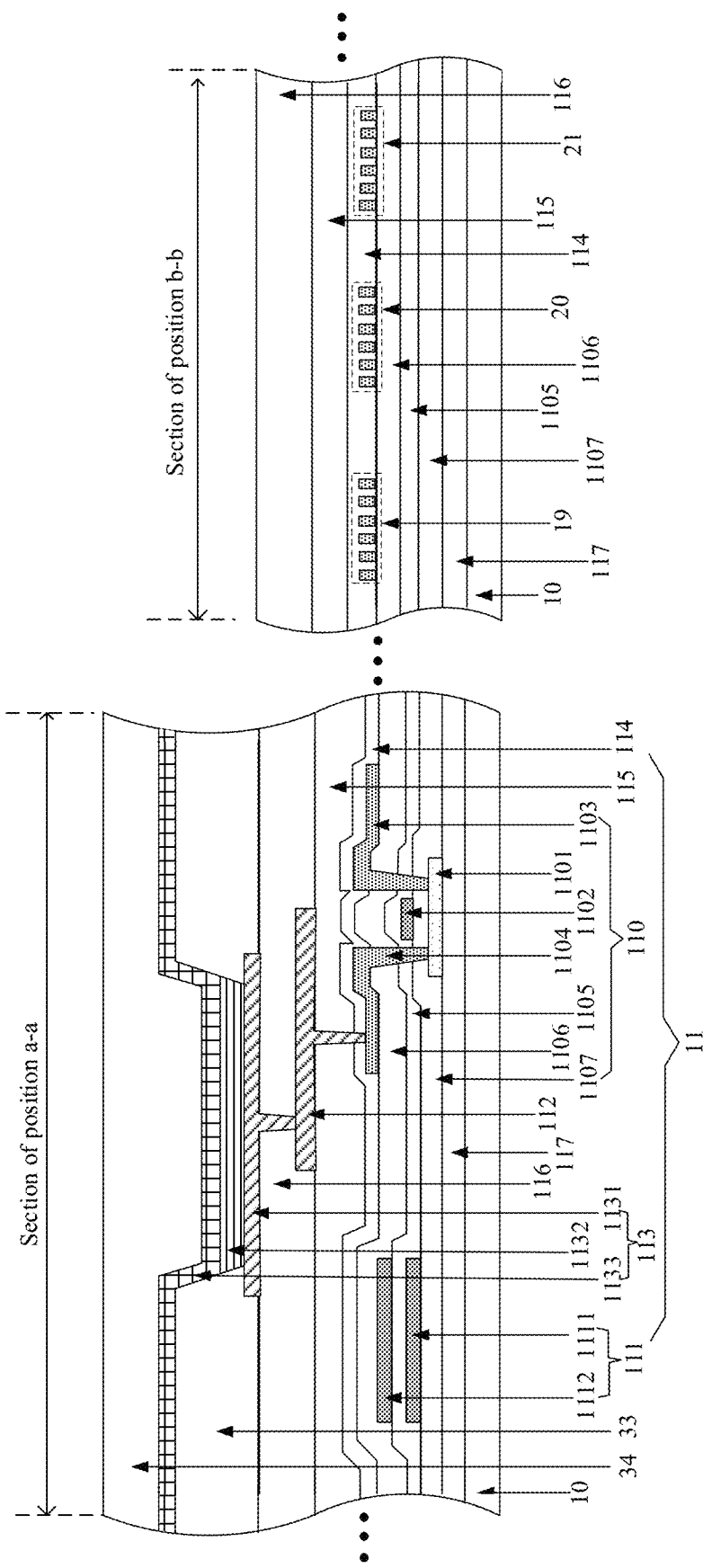
FIG. 4 is a sectional view of positions a-a and b-b of the array substrate as shown in FIG. 2.

Optionally, FIG. 4 shows a sectional view of positions a-a and b-b of the array substrate as shown in FIG. 2; with reference to FIG. 4, at least one of the sub-pixels 11 includes a thin film transistor 110; the thin film transistor 110 includes an active layer 1101 located on the substrate 10, a gate 1102 located at a side, away from the substrate 10, of the active layer 1101, and a source 1103 and a drain 1104 which are located at a side, away from the substrate 10, of the gate 1102, wherein the source 1103 and the drain 1104 are respectively electrically connected to the active layer 1101; and the first connecting conduction line group 19, the second connecting conduction line group 20 and the third connecting conduction line group 21 are all located in the same layer as the source 1103.

Optionally, as shown in FIG. 4, the thin film transistor 110 further includes a first insulating layer 1105 located at a side, away from the substrate 10, of the gate 1102, a second insulating layer 1106 located at a side, away from the substrate 10, of the first insulating layer 1105, and a third insulating layer 1107 located between the active layer 1101 and the gate 1102, wherein the second insulating layer 1106, the first insulating layer 1105 and the third insulating layer 1107 are provided with a source through-hole and a drain through-hole which are in communication; the source 1103 is electrically connected to the active layer 1101 via the source through-hole; and the drain 1104 is electrically connected to the active layer 1101 via the drain through-hole. It would be easy to understand that FIG. 4 performs description by taking the situation that the thin film transistor is a top-gate thin film transistor as an example. A person skilled in the art should understand that the thin film transistor in the embodiments of the present application can also be a bottom-gate thin film transistor, which is not limited by the embodiments of the present application.

Optionally, as shown in FIG. 4, the sub-pixel 11 further includes a storage capacitor 111, a connecting electrode 112 and a light emitting unit 113. The storage capacitor 111 includes a first polar plate 1111 and a second polar plate 1112; the first polar plate 1111 is located in the same layer as the gate 1102; the second polar plate 1112 is located between the first insulating layer 1105 and the second insulating layer 1106. The connecting electrode 112 is located at a side, away from the substrate 10, of the source 1103, and is electrically connected to the drain 1104 of the thin film transistor 110. The light emitting unit 113 is located at a side, away from the substrate 10, of the connecting electrode 112, and includes an anode 1131, a light emitting layer 1132 and a cathode 1133 which are superimposed in a direction away from the substrate 10, wherein the anode 1131 is electrically connected to the connecting electrode 112.

Optionally, as shown in FIG. 4, the sub-pixel 11 further includes s passivation layer 114 and a flat layer 115 which are located in the direction away from the sub-pixel and between the drain 1104 and the connecting electrode 112, a flat layer 116 located between the connecting electrode 112 and the anode 1131, and a buffer layer 117 located between the substrate 10 and the active layer 1101. The passivation layer 114 and the flat layer 115 are provided with a connecting through-hole which is in communication; and the connecting electrode 112 is electrically connected to the drain 1104 via the connecting through-hole. The flat layer 116 is provided with an anode through-hole; and the anode 1131 is electrically connected to the connecting electrode 112 via the anode through-hole.

Optionally, as shown in FIG. 4, the array substrate further includes a pixel defining layer 33 located at a side, away from the substrate 10, of the anode 117, and a package structure 34 located at a side, away from the substrate 10, of the cathode 1133. The pixel defining layer 33 includes a pixel region defined by a retaining wall structure; and the anode 117 is at least partially located in the pixel region. The package structure 34 is used to package the light emitting unit 33.

It should be noted that the first insulating layer 1105, the second insulating layer 1106, the third insulating layer 1107, the passivation layer 114, the flat layer 115, the flat layer 116 and the buffer layer 117 at the position b-b can be respectively a part, formed by extending to the peripheral region B2, of the first insulating layer 1105, the second insulating layer 1106, the third insulating layer 1107, the passivation layer 114, the flat layer 115, the flat layer 116 and the buffer layer 117 at the position a-a.

In summary, the embodiment of the present application provides an array substrate. The array substrate includes a first signal access terminal group, a second signal access terminal group, and a third signal access terminal group; the test circuit of the array substrate includes a first portion and a second portion; the first signal access terminal group is located at a side, away from the second portion, of the first portion; the second signal access terminal group is located between the first portion and the second portion; and the third signal access terminal group is located at a side, away from the first portion, of the second portion; furthermore, each one of the first signal access terminal group, the second signal access terminal group, and the third signal access terminal group is electrically connected to at least one of the first portion and the second portion; at least a part of the test sub-circuits of the test circuit are electrically connected to the plurality of data lines via at least two data signal transmission lines; that is, each one of the first signal access terminal group, the second signal access terminal group, and the third signal access terminal group is electrically connected to the data lines sequentially via the test circuit and the data signal transmission lines. Therefore, each signal access terminal group can be electrically connected to the data line close thereto via the data signal transmission line, such that the length and impedance of the data signal transmission line connected to each data line are both small, and the differences of the test signals received by the data lines are small, thus ensuring that the picture detection can be normally performed.

The present application provides an array substrate, including:

a substrate, including a display region and a peripheral region located on at least one side of the display region;

a plurality of sub-pixels, located in the display region;

a plurality of data lines, located in the display region and electrically connected to the plurality of sub-pixels;

a plurality of data signal transmission lines, located in the peripheral region and electrically connected to the plurality of data lines;

a test circuit, located in the peripheral region and at a side, away from the display region, of the plurality of data signal transmission lines, and including a first portion and a second portion which are separated, wherein the first portion and the second portion respectively include at least one test sub-circuit, and each one of at least a part of the test sub-circuits is electrically connected to at least two data signal transmission lines;

a first signal access terminal group, located in the peripheral region and at a side, away from the second portion, of the first portion;

a second signal access terminal group, located in the peripheral region and between the first portion and the second portion; and a third signal access terminal group, located in the peripheral region and at a side, away from the first portion, of the second portion;

wherein each one of the first signal access terminal group, the second signal access terminal group, and the third signal access terminal group is electrically connected to at least one of the first portion and the second portion.

Optionally, the array substrate further includes:

a fourth signal access terminal group located in the peripheral region; the fourth signal access terminal group is located between the first portion and the second portion, and is located between the second signal access terminal group and the third signal access terminal group; and the fourth signal access terminal group is electrically connected to at least one of the first portion and the second portion.

Optionally, the first signal access terminal group and the second signal access terminal group are respectively electrically connected to the first portion; the third signal access terminal group and the fourth signal access terminal group are respectively electrically connected to the second portion.

Optionally, the array substrate further includes: a first connecting conduction line group, a second connecting conduction line group, a third connecting conduction line group and a fourth connecting conduction line group which are located in the peripheral region;

the first signal access terminal group is electrically connected to the first portion via the first connecting conduction line group; the second signal access terminal group is electrically connected to the first portion via the second connecting conduction line group;

the third signal access terminal group is electrically connected to the second portion via the third connecting conduction line group; and the fourth signal access terminal group is electrically connected to the second portion via the fourth connecting conduction line group.

Optionally, at least one of the sub-pixels includes a thin film transistor;

the thin film transistor includes an active layer located on the substrate, a gate located at a side, away from the substrate, of the active layer, and a source and a drain which are located at a side, away from the substrate, of the gate; and the first connecting conduction line group, the second connecting conduction line group, the third connecting conduction line group, and the fourth connecting conduction line group are all located in the same layer as the source.

Optionally, the first signal access terminal group, the second signal access terminal group, the third signal access terminal group, and the fourth signal access terminal group respectively include a plurality of test terminals;

the first connecting conduction line group, the second connecting conduction line group, the third connecting conduction line group, and the fourth connecting conduction line group respectively include a plurality of connecting conduction lines; and the connecting conduction lines are electrically connected to the test terminals in a one-to-one correspondence.

Optionally, at least one of the test terminals includes a static electricity removal circuit and a contact pad; the static electricity removal circuit is located between the contact pad and the connecting conduction lines.

Figure 5:
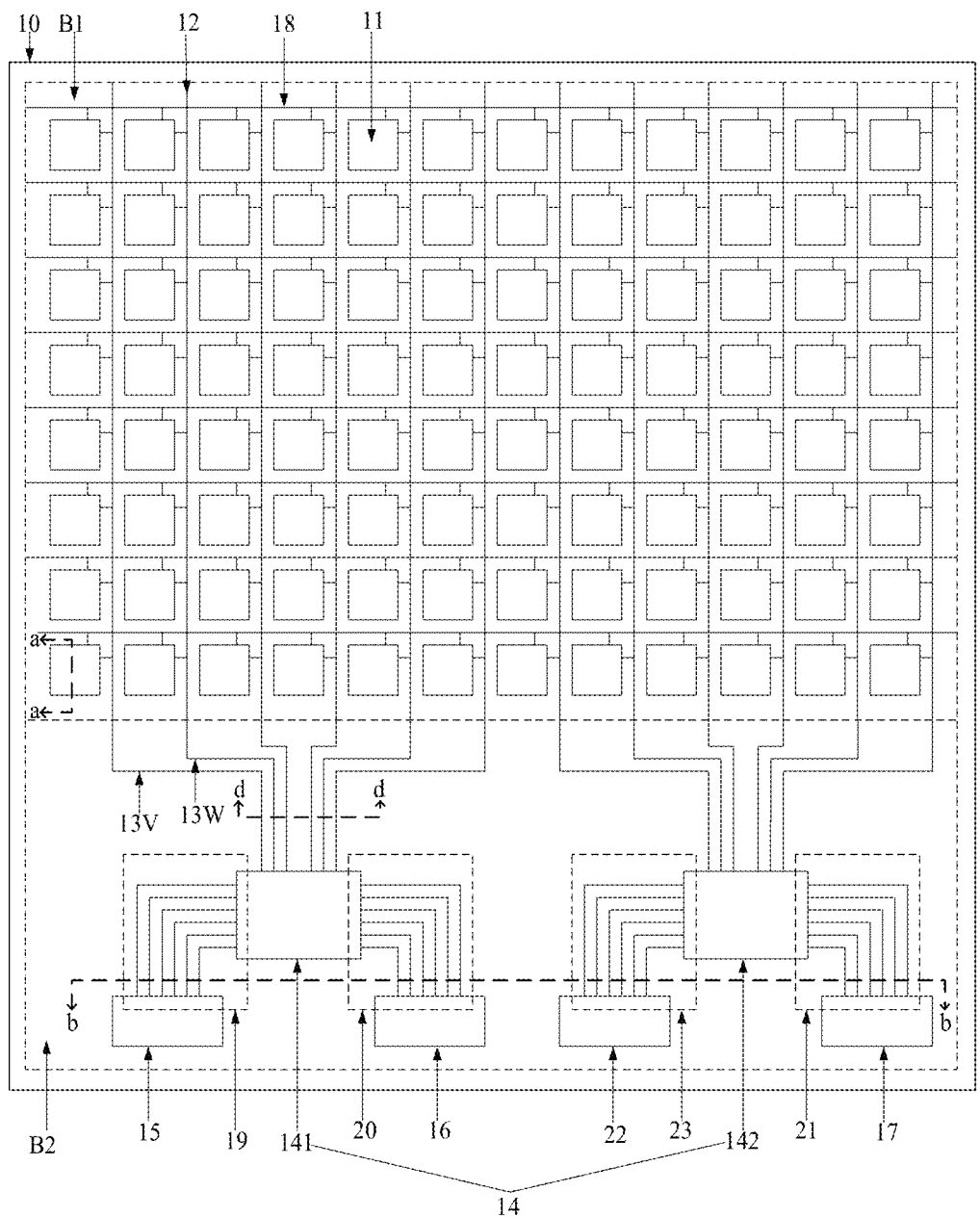
FIG. 5 is a front view of another array substrate provided by an embodiment of the present application.

Illustratively, FIG. 5 is a front view of another array substrate provided by an embodiment of the present application. With reference to FIG. 5, the array substrate includes:

a substrate 10, including a display region B1 and a peripheral region B2 located on at least one side of the display region B1;

a plurality of sub-pixels 11, located in the display region B1;

a plurality of data lines 12, located in the display region B1 and electrically connected to the plurality of sub-pixels 11;

a plurality of data signal transmission lines, located in the peripheral region B2 and electrically connected to the plurality of data lines 12, wherein the plurality of data signal transmission lines includes first data signal transmission lines 13V and second data signal transmission lines 13W which are alternately arranged; the first data signal transmission lines 13V and the second data signal transmission lines 13W can be arranged alternately one by one, or multiple by multiple; for example, two first data signal transmission lines 13V and two second data signal transmission lines 13W are arranged alternately (that is, two second data signal transmission lines 13W are arranged every two first data signal transmission lines 13V, and two first data signal transmission lines 13V are arranged every two second data signal transmission lines 13W); alternatively, one first data signal transmission line 13V and two second data signal transmission lines 13W are arranged alternately (that is, two second data signal transmission lines 13W are arranged every one first data signal transmission line 13V, and one first data signal transmission line 13V is arranged every two second data signal transmission lines 13W); and as shown in FIG. 5, the embodiment of the present application performs description by taking the situation that the first data signal transmission lines 13V and the second data signal transmission lines 13W are arranged alternately one by one as an example;

a test circuit 14, located in the peripheral region B2 and at a side, away from the display region B1, of the plurality of data signal transmission lines, and including a first portion 141 and a second portion 142 which are separated, wherein the first portion 141 and the second portion 142 respectively include at least one test sub-circuit (not shown in FIG. 5), and each one of at least a part of the test sub-circuits is electrically connected to at least two data signal transmission lines;

a first signal access terminal group 15, located in the peripheral region B2 and at a side, away from the second portion 142, of the first portion 141;

a second signal access terminal group 16, located in the peripheral region B2 and between the first portion 141 and the second portion 142; and a third signal access terminal group 17, located in the peripheral region B2 and at a side, away from the first portion 141, of the second portion 142, a fourth signal access terminal group 22, located in the peripheral region B2, between the first portion 141 and the second portion 142, and between the second signal access terminal group 16 and the third signal access terminal group 17, wherein each one of the first signal access terminal group 15, the second signal access terminal group 16, the third signal access terminal group 17, and the fourth signal access terminal group 22 is electrically connected to at least one of the first portion 141 and the second portion 142.

Optionally, as shown in FIG. 5, the array substrate further includes a plurality of gate lines 18 located in the display region B1; the plurality of gate lines 18 and the plurality of data lines 12 crosswise define a plurality of pixel regions; the plurality of sub-pixels 11 are located in the plurality of pixel regions, and are electrically connected to the plurality of gate lines 18 and the plurality of data lines 12; for example, the plurality of sub-pixels 11 are located in the plurality of pixel regions in a one-to-one correspondence; each gate line 18 is electrically connected to a row of sub-pixels 11; and each data line 12 is electrically connected to a column of sub-pixels 11.

Figure 6:
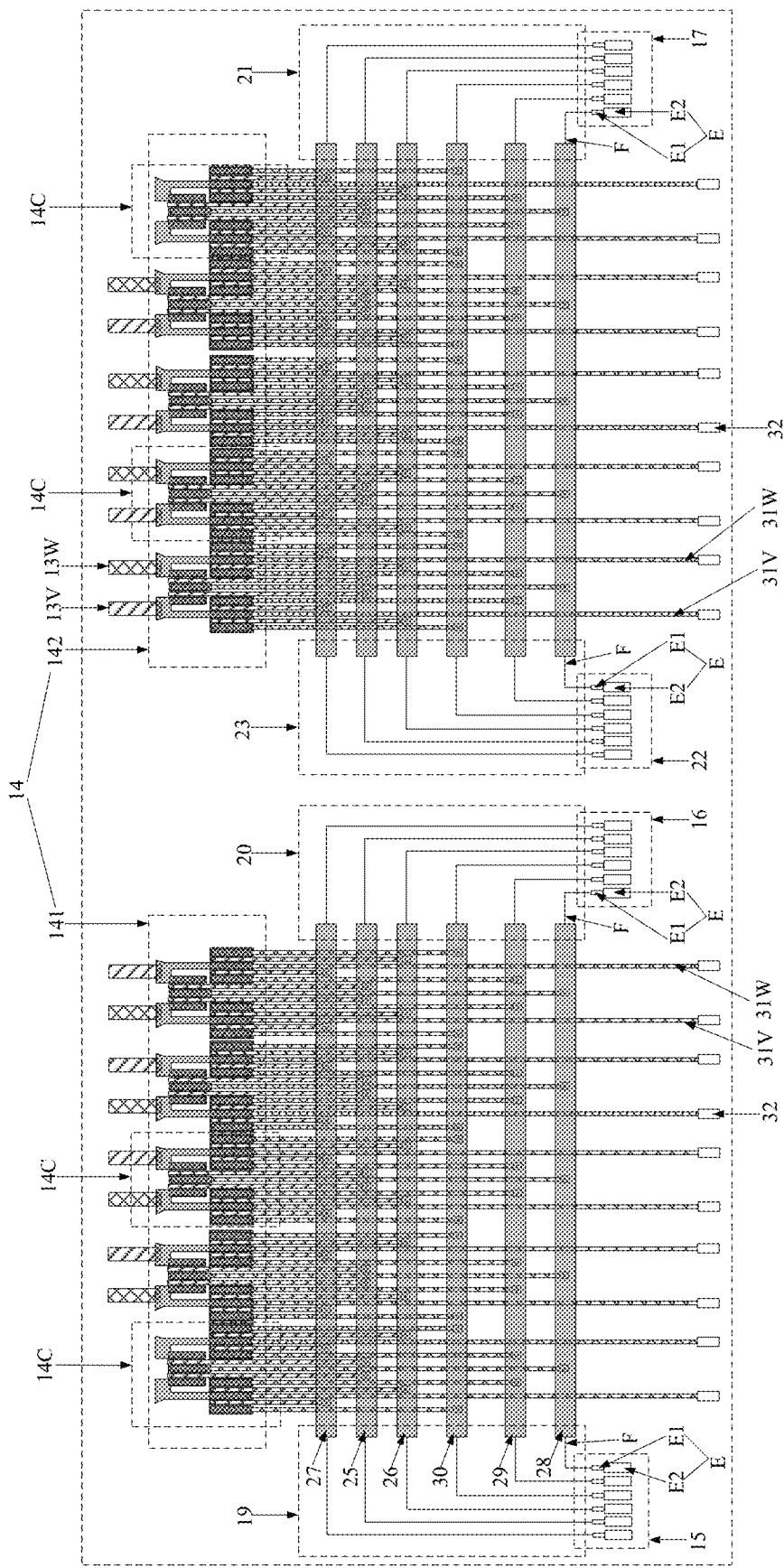
FIG. 6 is an enlarged view of a peripheral region of the array substrate as shown in FIG. 5.

Optionally, FIG. 6 shows an enlarged view of the peripheral region B2 of the array substrate as shown in FIG. 5. With reference to FIG. 6, the test circuit 14 includes a first portion 141 and a second portion 142 which are separated, wherein the first portion 141 and the second portion 142 respectively include at least one test sub-circuit, and each test sub-circuits 14C of at least a part of the test sub-circuits 14C is electrically connected to at least two data signal transmission lines.

Optionally, the first signal access terminal group 15 and the second signal access terminal group 16 are respectively electrically connected to the first portion 141; the third signal access terminal group 17 and the fourth signal access terminal group 22 are respectively electrically connected to the second portion 142. As shown in FIGS. 5 and 6, the array substrate further includes a first connecting conduction line group 19, a second connecting conduction line group 20, a third connecting conduction line group 21, and a fourth connecting conduction line group 23, wherein the first signal access terminal group 15 is electrically connected to the first portion 141 via the first connecting conduction line group 19; the second signal access terminal group 16 is electrically connected to the first portion 141 via the second connecting conduction line group 20; the third signal access terminal group 17 is electrically connected to the second portion 142 via the third connecting conduction line group 21; and the fourth signal access terminal group 22 is electrically connected to the second portion 142 via the fourth connecting conduction line group 23.

Optionally, as shown in FIG. 6, the first signal access terminal group 15, the second signal access terminal group 16, the third signal access terminal group 17, and the fourth signal access terminal group 22 respectively include a plurality of test terminals E; the first connecting conduction line group 19, the second connecting conduction line group 20, and the third connecting conduction line group 21, and the fourth connecting conduction line group 23 respectively include a plurality of connecting conduction lines F; and the connecting conduction lines F are electrically connected to the test terminals E in a one-to-one correspondence. Optionally, at least one of the test terminals E includes a static electricity removal circuit E1 and a contact pad E2, wherein the static electricity removal circuit E1 is located between the contact pad E2 and the connecting conduction lines F. The static electricity removal circuit E1 may be used to remove static electricity, thus avoiding the static electricity from damaging the test terminals E, avoiding the static electricity from being led to the test circuit 14 from the test terminals E and damaging the test circuit 14, and can avoiding the static electricity from being led to the display region B1 of the array substrate from the test circuit 14 and damaging the sub-pixels.

Figure 7:
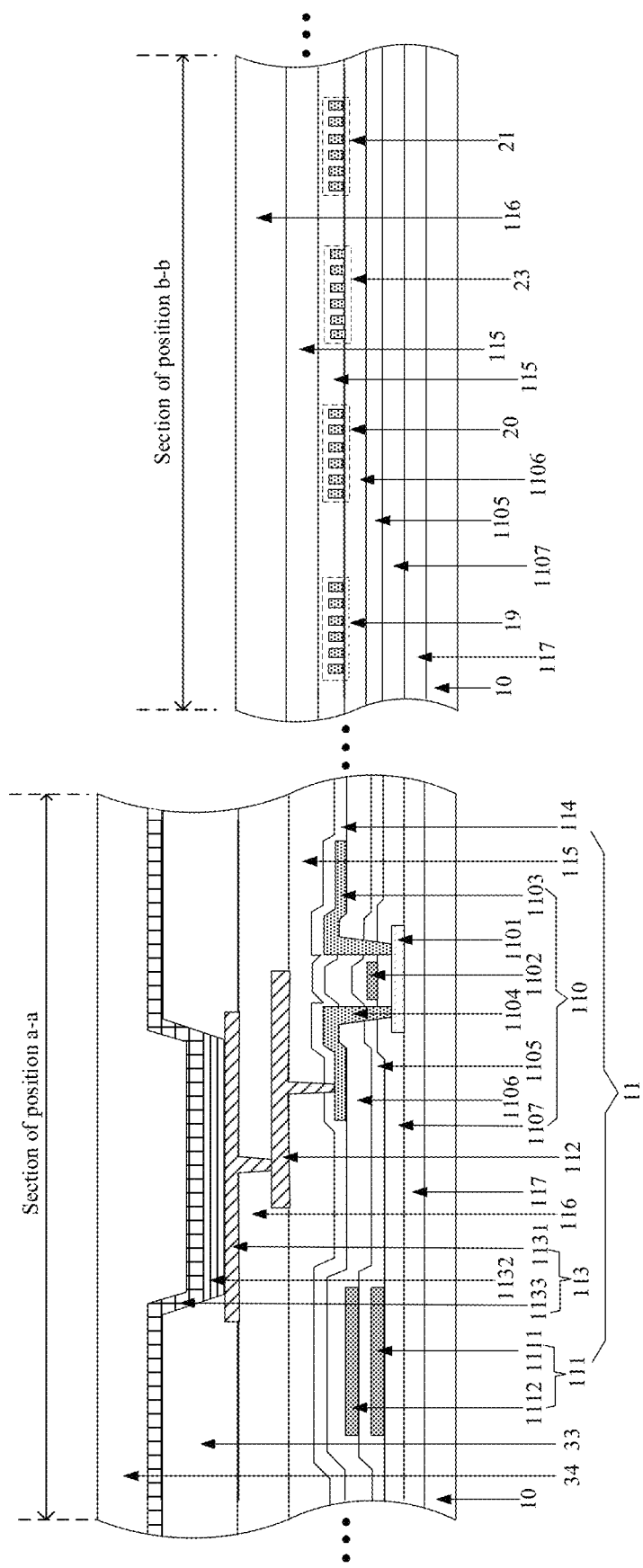
FIG. 7 is a sectional view of positions a-a and b-b of the array substrate as shown in FIG. 5.

Optionally, FIG. 7 shows a sectional view of positions a-a and b-b of the array substrate as shown in FIG. 5; with reference to FIG. 7, at least one of the sub-pixels 11 includes a thin film transistor 110; the thin film transistor 110 includes an active layer 1101 located on the substrate 10, a gate 1102 located at a side, away from the substrate 10, of the active layer 1101, and a source 1103 and a drain 1104 which are located at a side, away from the substrate 10, of the gate 1102; the first connecting conduction line group 19, the second connecting conduction line group 20, the third connecting conduction line group 21, and the fourth connecting conduction line group 23 are all located in the same layer as the source 1103.

It should be noted that the other features of the array substrate as shown in FIG. 7 can refer to the relevant descriptions in FIG. 4, and the embodiment of the present application will not be repeated here. Furthermore, with reference to FIG. 7, it would be easy to understand that FIG. 7 performs description by taking the situation that the thin film transistor is a top-gate thin film transistor as an example. A person skilled in the art should understand that the thin film transistor in the embodiments of the present application can also be a bottom-gate thin film transistor, which is not limited by the embodiments of the present application.

In summary, the embodiment of the present application provides an array substrate. The array substrate includes a first signal access terminal group, a second signal access terminal group, a third signal access terminal group, and a fourth signal access terminal group; the test circuit of the array substrate includes a first portion and a second portion; the first signal access terminal group is located at a side, away from the second portion, of the first portion; the second signal access terminal group is located between the first portion and the second portion; the third signal access terminal group is located at a side, away from the first portion, of the second portion; and the fourth signal access terminal group is located between the first portion and the second portion and between the second signal access terminal group and the third signal access terminal group; each one of the first signal access terminal group, the second signal access terminal group, the third signal access terminal group, and the fourth signal access terminal group is electrically connected to at least one of the first portion and the second portion; at least a part of the test sub-circuits of the test circuit are electrically connected to the plurality of data lines via at least two data signal transmission lines; that is, each one of the first signal access terminal group, the second signal access terminal group, the third signal access terminal group, and the fourth signal access terminal group is electrically connected to the data lines sequentially via the test circuit and the data signal transmission lines. Therefore, each signal access terminal group can be electrically connected to the data line close thereto via the data signal transmission line, such that the length and impedance of the data signal transmission line connected to each data line are both small, and the differences of the test signals received by the data lines are small, thus ensuring that the picture detection can be normally performed.

The present application provides an array substrate, including:

a substrate, including a display region and a peripheral region located on at least one side of the display region;

a plurality of sub-pixels, located in the display region;

a plurality of data lines, located in the display region and electrically connected to the plurality of sub-pixels;

a plurality of data signal transmission lines, located in the peripheral region and electrically connected to the plurality of data lines;

a test circuit, located in the peripheral region and at a side, away from the display region, of the plurality of data signal transmission lines, and including a first portion and a second portion which are separated, wherein the first portion and the second portion respectively include at least one test sub-circuit, and each one of at least a part of the test sub-circuits is electrically connected to at least two data signal transmission lines;

a first signal access terminal group, located in the peripheral region and at a side, away from the second portion, of the first portion;

a second signal access terminal group, located in the peripheral region and between the first portion and the second portion; and a third signal access terminal group, located in the peripheral region and at a side, away from the first portion, of the second portion;

wherein each one of the first signal access terminal group, the second signal access terminal group, and the third signal access terminal group is electrically connected to at least one of the first portion and the second portion.

Optionally, the array substrate further includes:

a fourth signal access terminal group located in the peripheral region; the fourth signal access terminal group is located between the first portion and the second portion, and is located between the second signal access terminal group and the third signal access terminal group; and the fourth signal access terminal group is electrically connected to at least one of the first portion and the second portion.

Optionally, the first signal access terminal group and the second signal access terminal group are respectively electrically connected to the first portion; the third signal access terminal group and the fourth signal access terminal group are respectively electrically connected to the second portion.

Optionally, the array substrate further includes: a first connecting conduction line group, a second connecting conduction line group, a third connecting conduction line group and a fourth connecting conduction line group which are located in the peripheral region;

the first signal access terminal group is electrically connected to the first portion via the first connecting conduction line group; the second signal access terminal group is electrically connected to the first portion via the second connecting conduction line group;

the third signal access terminal group is electrically connected to the second portion via the third connecting conduction line group; and the fourth signal access terminal group is electrically connected to the second portion via the fourth connecting conduction line group.

Optionally, at least one of the sub-pixels includes a thin film transistor;

the thin film transistor includes an active layer located on the substrate, a gate located at a side, away from the substrate, of the active layer, and a source and a drain which are located at a side, away from the substrate, of the gate; and the first connecting conduction line group, the second connecting conduction line group, the third connecting conduction line group, and the fourth connecting conduction line group are all located in the same layer as the source.

Optionally, the array substrate further includes:

a bridging conduction line group connecting the first portion to the second portion; the bridging conduction line group is located in the peripheral region, and includes a plurality of bridging conduction lines; at least one bridging conduction line includes a first conduction line section, a second conduction line section, and a bridging section connecting the first conduction line section to the second conduction line section;

the first conduction line section is located adjacent to the first portion; the second conduction line section is located adjacent to the second portion; and the bridging section is located in a region between the first portion and the second portion.

Optionally, at least one of the sub-pixels includes a thin film transistor and a storage capacitor;

the thin film transistor includes an active layer located on the substrate, a gate located at a side, away from the substrate, of the active layer, a first insulating layer located at a side, away from the substrate, of the gate, a second insulating layer located at a side, away from the substrate, of the first insulating layer, and a source and a drain which are located at a side, away from the substrate, of the second insulating layer;

The storage capacitor includes a first polar plate and a second polar plate; the first polar plate is located in the same layer as the gate; the second polar plate is located between the first insulating layer and the second insulating layer;

The first conduction line section includes a first sub-layer of the first conduction line section, and a second sub-layer of the first conduction line section; the second conduction line section includes a first sub-layer of the second conduction line section and a second sub-layer of the second conduction line section; the bridging section, the first sub-layer of the first conduction line section, and the first sub-layer of the second conduction line section are located in the same layer as the gate; the second sub-layer of the first conduction line section, and the second sub-layer of the second conduction line section are located in the same layer as the second polar plate; the first sub-layer of the first conduction line section and the second sub-layer of the first conduction line section are electrically connected via a first conduction line through-hole; and the first sub-layer of the second conduction line section and the second sub-layer of second conduction line section are electrically connected via a second conduction line through-hole.

Optionally, the first signal access terminal group, the second signal access terminal group, the third signal access terminal group, and the fourth signal access terminal group respectively include a plurality of test terminals;

The first connecting conduction line group, the second connecting conduction line group, the third connecting conduction line group, and the fourth connecting conduction line group respectively include a plurality of connecting conduction lines; and the connecting conduction lines are electrically connected to the test terminals in a one-to-one correspondence.

Optionally, at least one of the test terminals includes a static electricity removal circuit and a contact pad; the static electricity removal circuit is located between the contact pad and the connecting conduction lines.

Figure 8:
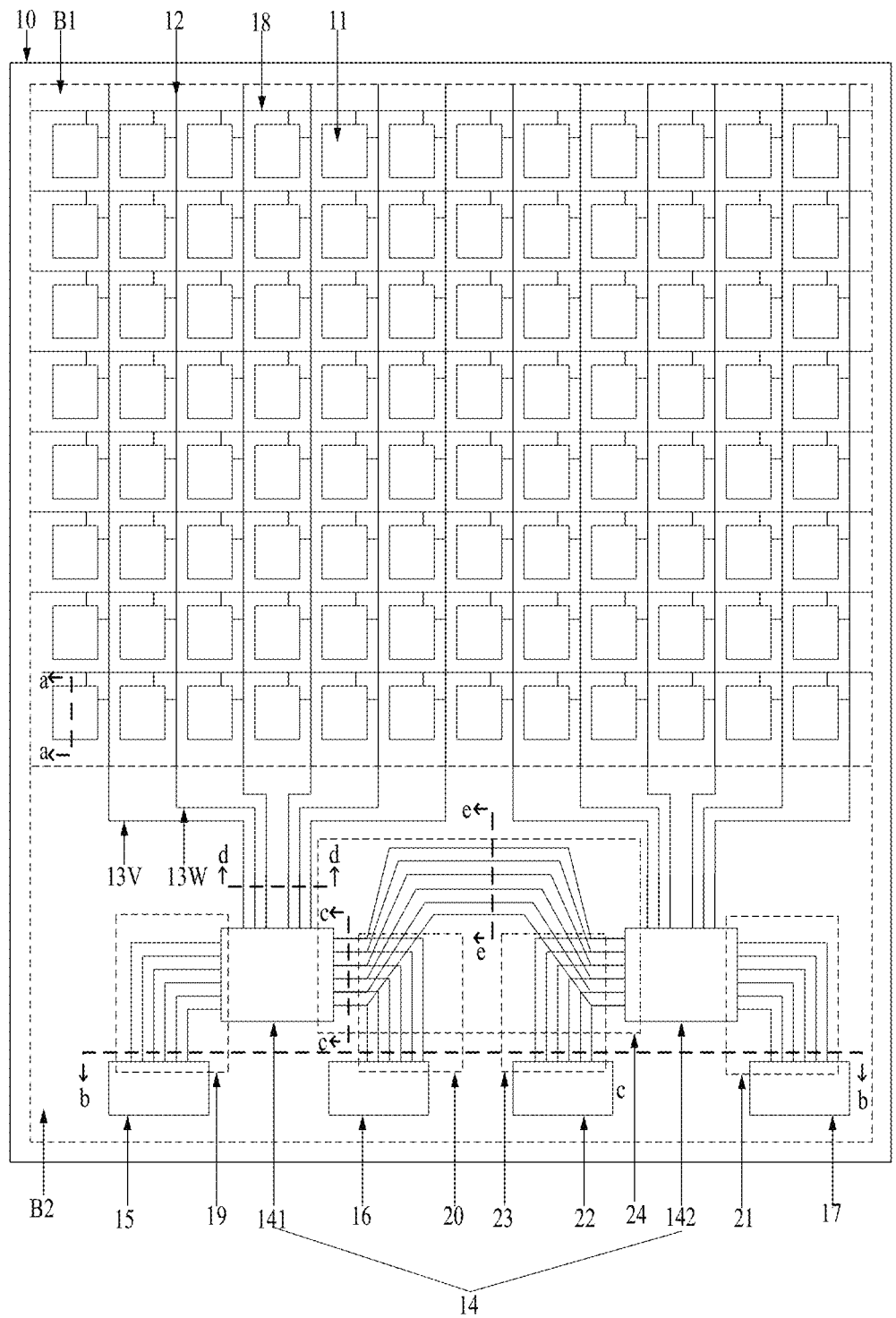
FIG. 8 is a front view of still another array substrate provided by an embodiment of the present application.

Illustratively, FIG. 8 is a front view of still another array substrate provided by an embodiment of the present application. With reference to FIG. 8, the array substrate includes:

a substrate 10, including a display region B1 and a peripheral region B2 located on at least one side of the display region B1;

a plurality of sub-pixels 11, located in the display region B1;

a plurality of data lines 12, located in the display region B1 and electrically connected to the plurality of sub-pixels 11;

a plurality of data signal transmission lines, located in the peripheral region B2 and electrically connected to the plurality of data lines 12, wherein the plurality of data signal transmission lines includes first data signal transmission lines 13V and second data signal transmission lines 13W which are alternately arranged; the first data signal transmission lines 13V and the second data signal transmission lines 13W can be arranged alternately one by one, or multiple by multiple; for example, two first data signal transmission lines 13V and two second data signal transmission lines 13W are arranged alternately (that is, two second data signal transmission lines 13W are arranged every two first data signal transmission lines 13V, and two first data signal transmission lines 13V are arranged every two second data signal transmission lines 13W); alternatively, one first data signal transmission line 13V and two second data signal transmission lines 13W are arranged alternately (that is, two second data signal transmission lines 13W are arranged every one first data signal transmission line 13V, and one first data signal transmission line 13V is arranged every two second data signal transmission lines 13W); and as shown in FIG. 8, the embodiment of the present application performs description by taking the situation that the first data signal transmission lines 13V and the second data signal transmission lines 13W are arranged alternately one by one as an example;

a test circuit 14, located in the peripheral region B2 and at a side, away from the display region B1, of the plurality of data signal transmission lines, and including a first portion 141 and a second portion 142 which are separated, wherein the first portion 141 and the second portion 142 respectively include at least one test sub-circuit (not shown in FIG. 8), and each one of at least a part of the test sub-circuits is electrically connected to at least two data signal transmission lines;

a first signal access terminal group 15, located in the peripheral region B2 and at a side, away from the second portion 142, of the first portion 141;

a second signal access terminal group 16, located in the peripheral region B2 and between the first portion 141 and the second portion 142; and a third signal access terminal group 17, located in the peripheral region B2 and at a side, away from the first portion 141, of the second portion 142, a fourth signal access terminal group 22, located in the peripheral region B2, between the first portion 141 and the second portion 142, and between the second signal access terminal group 16 and the third signal access terminal group 17, wherein each one of the first signal access terminal group 15, the second signal access terminal group 16, the third signal access terminal group 17, and the fourth signal access terminal group 22 is electrically connected to at least one of the first portion 141 and the second portion 142.

Optionally, as shown in FIG. 8, the array substrate further includes a plurality of gate lines 18 located in the display region B1; the plurality of gate lines 18 and the plurality of data lines 12 crosswise define a plurality of pixel regions; the plurality of sub-pixels 11 are located in the plurality of pixel regions, and are electrically connected to the plurality of gate lines 18 and the plurality of data lines 12; for example, the plurality of sub-pixels 11 are located in the plurality of pixel regions in a one-to-one correspondence; each gate line 18 is electrically connected to a row of sub-pixels 11; and each data line 12 is electrically connected to a column of sub-pixels 11.

Figure 9:
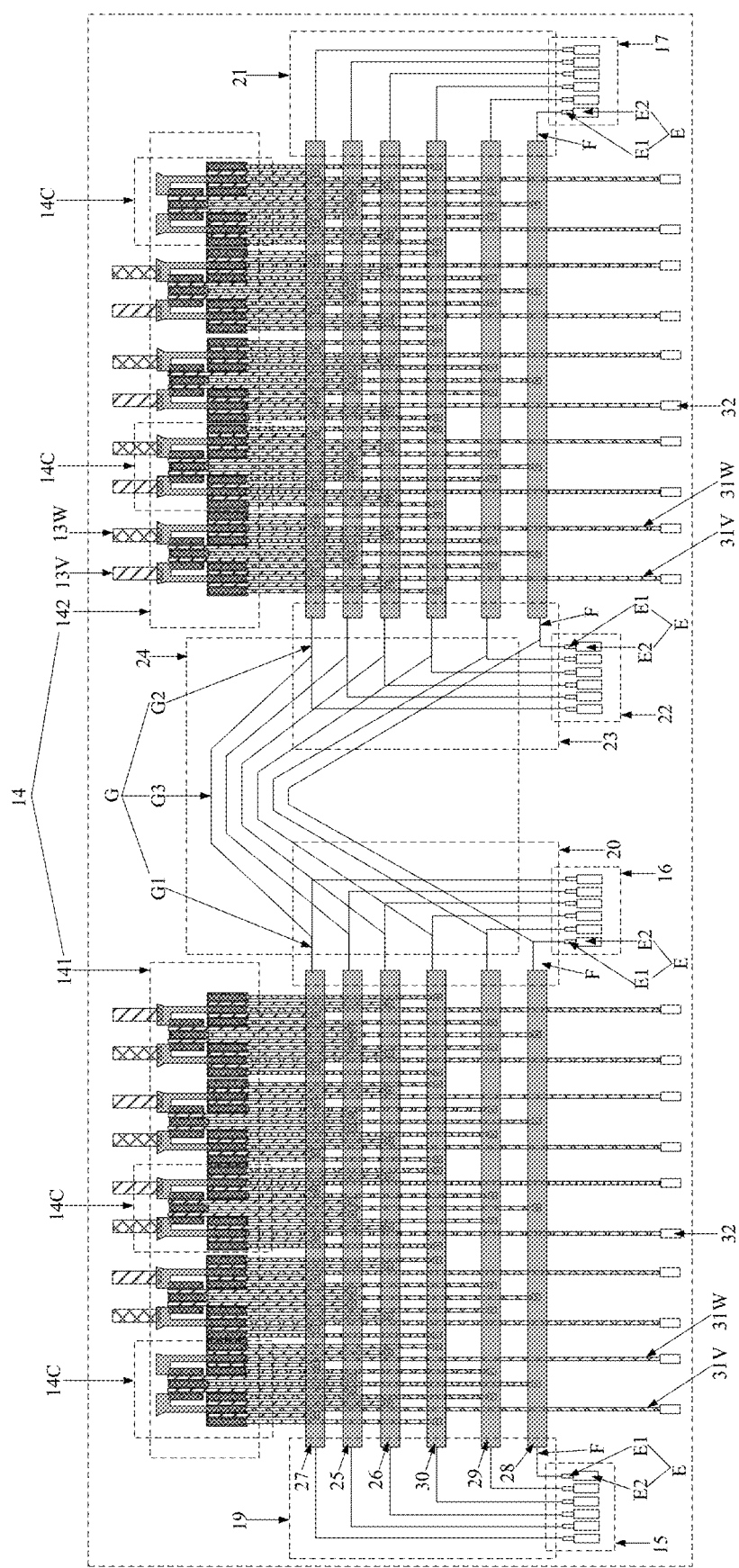
FIG. 9 is an enlarged view of a peripheral region of the array substrate as shown in FIG. 8.

Optionally, FIG. 9 shows an enlarged view of the peripheral region B2 of the array substrate as shown in FIG. 8. With reference to FIG. 9, the test circuit 14 includes a first portion 141 and a second portion 142 which are separated, wherein the first portion 141 and the second portion 142 respectively include at least one test sub-circuit, and each test sub-circuits 14C of at least a part of the test sub-circuits 14C is electrically connected to at least two data signal transmission lines.

Optionally, the first signal access terminal group 15 and the second signal access terminal group 16 are respectively electrically connected to the first portion 141; the third signal access terminal group 17 and the fourth signal access terminal group 22 are respectively electrically connected to the second portion 142. As shown in FIGS. 8 and 9, the array substrate further includes a first connecting conduction line group 19, a second connecting conduction line group 20, a third connecting conduction line group 21, and a fourth connecting conduction line group 23, wherein the first signal access terminal group 15 is electrically connected to the first portion 141 via the first connecting conduction line group 19; the second signal access terminal group 16 is electrically connected to the first portion 141 via the second connecting conduction line group 20; the third signal access terminal group 17 is electrically connected to the second portion 142 via the third connecting conduction line group 21; and the fourth signal access terminal group 22 is electrically connected to the second portion 142 via the fourth connecting conduction line group 23.

Optionally, as shown in FIG. 9, the first signal access terminal group 15, the second signal access terminal group 16, the third signal access terminal group 17, and the fourth signal access terminal group 22 respectively include a plurality of test terminals E; the first connecting conduction line group 19, the second connecting conduction line group 20, and the third connecting conduction line group 21, and the fourth connecting conduction line group 23 respectively include a plurality of connecting conduction lines F; and the connecting conduction lines F are electrically connected to the test terminals E in a one-to-one correspondence. Optionally, at least one of the test terminals E includes a static electricity removal circuit E1 and a contact pad E2, wherein the static electricity removal circuit E1 is located between the contact pad E2 and the connecting conduction lines F. The static electricity removal circuit E1 may be used to remove static electricity, thus avoiding the static electricity from damaging the test terminals E, avoiding the static electricity from being led to the test circuit 14 from the test terminals E and damaging the test circuit 14, and can avoiding the static electricity from being led to the display region B1 of the array substrate from the test circuit 14 and damaging the sub-pixels.

Optionally, still with reference to FIGS. 8 and 9, the array substrate includes a bridging conduction line group 24 connecting the first portion 141 to the second portion 142; the bridging conduction line group 24 includes a plurality of bridging conduction lines G; at least one of the plurality of bridging conduction lines G includes a first conduction line section G1, a second conduction line section G2, and a bridging section G3 connecting the first conduction line section G1 to the second conduction line section G2; the first conduction line section G1 is located adjacent to the first portion 141; the second conduction line section G2 is located adjacent to the second portion 142; and the bridging section G3 is located in a region between the first portion 141 and the second portion 142. Wherein FIGS. 8 and 9 perform description by taking the situation that each one of the plurality of bridging conduction lines G includes a first conduction line section G1, a second conduction line section G2, and a bridging section G3 as an example. A person skilled in the art could easily understand that the plurality of bridging conduction lines G can also be configured as follows: a part of the plurality of bridging conduction lines G include a first conduction line section G1, a second conduction line section G2, and a bridging section G3, and the other part of the plurality of bridging conduction lines G include a first conduction line section G1, and a second conduction line section G2, which is not limited by the embodiments of the present application.

In the embodiment of the present application, the sectional view of the positions a-a and b-b of the array substrate as shown in FIG. 8 can refer to FIG. 7, and will not be repeated here. Optionally, FIG. 10 shows a sectional view of positions b-b, c-c, e-e and d-d of the array substrate as shown in FIG. 8; with reference to FIGS. 10 and 7, the first conduction line section G1 includes a first sub-layer G11 of the first conduction line section, and a second sub-layer G12 of the first conduction line section; the second conduction line section G2 includes a first sub-layer (not shown in FIG. 10) of the second conduction line section and a second sub-layer (not shown in FIG. 10) of the second conduction line section; the bridging section G3, the first sub-layer G11 of the first conduction line section, and the first sub-layer of the second conduction line section are located in the same layer as the gate 1102; the second sub-layer G12 of the first conduction line section and the second sub-layer of the second conduction line section are located in the same layer as the second polar plate 1112; the first sub-layer G11 of the first conduction line section and the second sub-layer G12 of the first conduction line section are electrically connected via a first conduction line through-hole; and the first sub-layer of the second conduction line section and the second sub-layer of second conduction line section are electrically connected via a second conduction line through-hole (not shown in FIG. 10).

Figure 10:
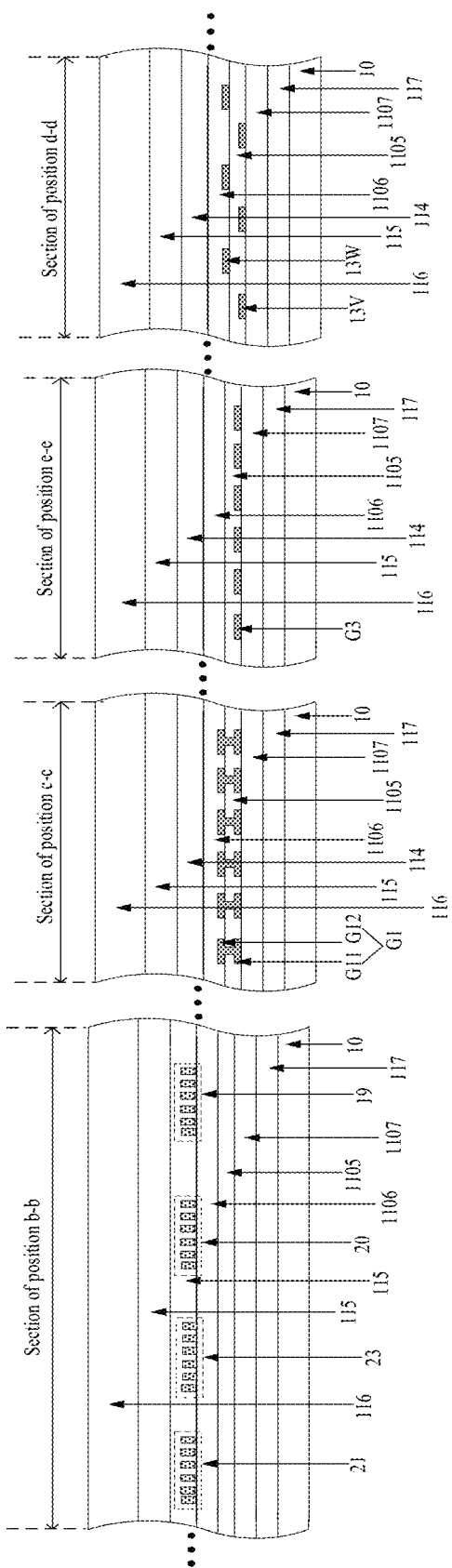
FIG. 10 is a sectional view of positions b-b, c-c, e-e and d-d of the array substrate as shown in FIG. 8.

Optionally, with reference to FIGS. 10 and 7, the first data signal transmission lines 13V are located in the same layer as the gate 1102; and the second data signal transmission lines 13W are located in the same layer as the second polar plate 1112.

It should be noted that the FIG. 10 describes the sections of the position d-d by taking the array substrate as shown in FIG. 8 as an example, and the section of the position d-d of the array substrate as shown in FIGS. 2 and 5 can refer to FIG. 10, and will not be repeated here. In addition, the first insulating layer 1105, the second insulating layer 1106, the third insulating layer 1107, the passivation layer 114, the flat layer 115, the flat layer 116 and the buffer layer 117 in FIG. 10 can be respectively a part, formed by extending to the peripheral region B2, of the first insulating layer 1105, the second insulating layer 1106, the third insulating layer 1107, the passivation layer 114, the flat layer 115, the flat layer 116 and the buffer layer 117 at the position a-a.

In summary, the embodiment of the present application provides an array substrate. The array substrate includes a first signal access terminal group, a second signal access terminal group, a third signal access terminal group, and a fourth signal access terminal group; the test circuit of the array substrate includes a first portion and a second portion; the first signal access terminal group is located at a side, away from the second portion, of the first portion; the second signal access terminal group is located between the first portion and the second portion; the third signal access terminal group is located at a side, away from the first portion, of the second portion; and the fourth signal access terminal group is located between the first portion and the second portion and between the second signal access terminal group and the third signal access terminal group; each one of the first signal access terminal group, the second signal access terminal group, the third signal access terminal group, and the fourth signal access terminal group is electrically connected to at least one of the first portion and the second portion; at least a part of the test sub-circuits of the test circuit are electrically connected to the plurality of data lines via at least two data signal transmission lines; that is, each one of the first signal access terminal group, the second signal access terminal group, the third signal access terminal group, and the fourth signal access terminal group is electrically connected to the data lines sequentially via the test circuit and the data signal transmission lines. Therefore, each signal access terminal group can be electrically connected to the data line close thereto via the data signal transmission line, such that the length and impedance of the data signal transmission line connected to each data line are both small, and the differences of the test signals received by the data lines are small, thus ensuring that the picture detection can be normally performed.

It is easy to know according to the above descriptions that in the embodiment of the present application, the test circuit includes a first portion and a second portion which are separated, wherein the first portion and the second portion respectively include at least one test sub-circuit, and each one of at least a part of the test sub-circuits is electrically connected to at least two data signal transmission lines.

Optionally, the first portion includes a first effective test sub-circuit and a first redundant test sub-circuit; the second portion includes a second effective test sub-circuit and a second redundant test sub-circuit;

the first effective test sub-circuit is located between the first redundant test sub-circuit and the second portion; and the second effective test sub-circuit is located between the second redundant test sub-circuit and the first portion.

Optionally, each first effective test sub-circuit is electrically connected to two data signal transmission lines; and each second effective test sub-circuit is electrically connected two data signal transmission lines.

Optionally, the test sub-circuit includes a first multiplexed switch, a second multiplexed switch, a third multiplexed switch, a first connecting portion, and a second connecting portion; the second multiplexed switch and the third multiplexed switch are respectively located at a side, away from the display region, of the first multiplexed switch;

the plurality of sub-pixels include a plurality of first sub-pixels, a plurality of second sub-pixels, and a plurality of third sub-pixels;

the first multiplexed switch is located at a side, away from the display region, of the plurality of data signal transmission lines; the first multiplexed switch is respectively electrically connected to the first connecting portion and the second connecting portion, and is used to transmit a data signal of one first sub-pixel to the data signal transmission lines via the first connecting portion and the second connecting portion in different time periods, and transmit, via the data signal transmission lines, the data signal to other first sub-pixels electrically connected to different data lines;

the second multiplexed switch is electrically connected to the first connecting portion, and is used to transmit a data signal of one second sub-pixel or a data signal of one third sub-pixel to the data signal transmission lines via the first connecting portion in different time periods, and transmit, via the data signal transmission lines, the data signal to other second sub-pixels or other third sub-pixels electrically connected to the same data lines; and the third multiplexed switch is electrically connected to the second connecting portion, and is used to transmit a data signal of one second sub-pixel or a data signal of one third sub-pixel to the data signal transmission lines via the second connecting portion in different time periods, and transmit, via the data signal transmission lines, the data signal to other second sub-pixels or other third sub-pixels electrically connected to the same data lines.

Optionally, the first multiplexed switch includes:

an active layer of the first multiplexed switch located on the substrate;

a first gate of the first multiplexed switch and a second gate of the first multiplexed switch which are located at a side, away from the substrate, of the active layer of the first multiplexed switch, an orthographic projection of the first gate of the first multiplexed switch on the substrate staggering from an orthographic projection of the second gate of the first multiplexed switch on the substrate;

a source of the first multiplexed switch, a first drain of the first multiplexed switch, and a second drain of the first multiplexed switch which are located at a side, away from the substrate, of the first gate of the first multiplexed switch and the second gate of the first multiplexed switch, wherein the source of the first multiplexed switch is located between the first drain of the first multiplexed switch and the second drain of the first multiplexed switch;

the orthographic projection of the first gate of the first multiplexed switch on the substrate falls between orthographic projections of the first drain of the first multiplexed switch and the source of the first multiplexed switch on the substrate; and the orthographic projection of the second gate of the first multiplexed switch on the substrate falls between orthographic projections of the second drain of the first multiplexed switch and the source of the first multiplexed switch on the substrate.

Optionally, the second multiplexed includes:

an active layer of the second multiplexed switch located on the substrate;

a first gate of the second multiplexed switch and a second gate of the second multiplexed switch which are located at a side, away from the substrate, of the active layer of the second multiplexed switch, an orthographic projection of the first gate of the second multiplexed switch on the substrate staggering from an orthographic projection of the second gate of the second multiplexed switch on the substrate;

a first source of the second multiplexed switch, a drain of the second multiplexed switch, and a second source of the second multiplexed switch which are located at a side, away from the substrate, of the first gate of the second multiplexed switch and the second gate of the second multiplexed switch, wherein the drain of the second multiplexed switch is located between the first source of the second multiplexed switch and the second source of the second multiplexed switch;

the orthographic projection of the first gate of the second multiplexed switch on the substrate falls between orthographic projections of the first source of the second multiplexed switch and the drain of the second multiplexed switch on the substrate; and the orthographic projection of the second gate of the second multiplexed switch on the substrate falls between orthographic projections of the drain of the second multiplexed switch and the second source of the second multiplexed switch on the substrate.

Optionally, the third multiplexed switch includes:

an active layer of the third multiplexed switch located on the substrate;

a first gate of the third multiplexed switch and a second gate of the third multiplexed switch which are located at a side, away from the substrate, of the active layer of the third multiplexed switch, an orthographic projection of the first gate of the third multiplexed switch on the substrate staggering from an orthographic projection of the second gate of the third multiplexed switch on the substrate;

a first source of the third multiplexed switch, a drain of the third multiplexed switch, and a second source of the third multiplexed switch which are located at a side, away from the substrate, of the first gate of the third multiplexed switch and the second gate of the third multiplexed switch, wherein the drain of the third multiplexed switch is located between the first source of the third multiplexed switch and the second source of the third multiplexed switch;

the orthographic projection of the first gate of the third multiplexed switch on the substrate falls between orthographic projections of the first source of the third multiplexed switch and the drain of the third multiplexed switch on the substrate; and the orthographic projection of the second gate of the third multiplexed switch on the substrate falls between orthographic projections of the drain of the third multiplexed switch and the second source of the third multiplexed switch on the substrate.

Optionally, the array substrate further includes:

a plurality of test control lines arranged in parallel, and located in the peripheral region and at a side, away from the display region, of the second multiplexed switch and the third multiplexed switch; the plurality of test control lines include a first sub-pixel gate control line, a second sub-pixel gate control line, a third sub-pixel gate control line, a first sub-pixel data control line, a second sub-pixel data control line, and a third sub-pixel data control line;

the first sub-pixel gate control line is electrically connected to the first gate of the first multiplexed switch and the second gate of the first multiplexed switch; the second sub-pixel gate control line is electrically connected to the second gate of the second multiplexed switch and the second gate of the third multiplexed switch; the third sub-pixel gate control line is electrically connected to the first gate of the second multiplexed switch and the first gate of the third multiplexed switch; the first sub-pixel data control line is electrically connected to the source of the first multiplexed switch; the second sub-pixel data control line is respectively electrically connected to the first source of the second multiplexed switch and the second source of the third multiplexed switch; and the third sub-pixel data control line is respectively electrically connected to the second source of the second multiplexed switch and the first source of the third multiplexed switch.

Optionally, the first sub-pixel gate control line includes a first sub-layer of the first sub-pixel gate control line and a second sub-layer of the first sub-pixel gate control line; the second sub-pixel gate control line includes a first sub-layer of the second sub-pixel gate control line and a second sub-layer of the second sub-pixel gate control line; and the third sub-pixel gate control line includes a first sub-layer of the third sub-pixel gate control line and a second sub-layer of the third sub-pixel gate control line;

the first sub-pixel data control line includes a first sub-layer of the first sub-pixel data control line and a second sub-layer of the first sub-pixel data control line; the second sub-pixel data control line includes a first sub-layer of the second sub-pixel data control line and a second sub-layer of the second sub-pixel data control line; and the third sub-pixel data control line includes a first sub-layer of the third sub-pixel data control line and a second sub-layer of the third sub-pixel data control line;

the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are located in the same layer; the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are located in the same layer; furthermore, the layer that the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are located is different from the layer that the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are located;

the first sub-layer of the first sub-pixel gate control line and the second sub-layer of the first sub-pixel gate control line are electrically connected via a gate through-hole of the first sub-pixel; the first sub-layer of the second sub-pixel gate control line and the second sub-layer of the second sub-pixel gate control line are electrically connected via a gate through-hole of the second sub-pixel; and the first sub-layer of the third sub-pixel gate control line and the second sub-layer of the third sub-pixel gate control line are electrically connected via a gate through-hole of the third sub-pixel;

the first sub-layer of the first sub-pixel data control line and the second sub-layer of the first sub-pixel data control line are electrically connected via a data through-hole of the first sub-pixel; the first sub-layer of the second sub-pixel data control line and the second sub-layer of the second sub-pixel data control line are electrically connected via a data through-hole of the second sub-pixel; and the first sub-layer of the third sub-pixel data control line and the second sub-layer of the third sub-pixel data control line are electrically connected via a data through-hole of the third sub-pixel.

Optionally, at least one of the sub-pixels includes a thin film transistor and a connecting electrode;

the thin film transistor includes an active layer located on the substrate, a gate located at a side, away from the substrate, of the active layer, and a source and a drain which are located at a side, away from the substrate, of the gate; and the connecting electrode is located at a side, away from the substrate, of the source;

the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are located in the same layer as the source;

the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are located in the same layer as the connecting electrode.

Optionally, the first connecting portion and the second connecting portion are located in the same layer as the source.

Optionally, the array substrate further includes: a plurality of data signal input lines, located in the peripheral region; the plurality of data signal input lines are respectively electrically connected to the first connecting portion and the second connecting portion via the second multiplexed switch and the third multiplexed switch.

Optionally, the array substrate further includes: a plurality of signal input terminals, located in the peripheral region and at a side, away from the display region, of the plurality of data signal input lines; the plurality of signal input terminals are electrically connected to the plurality of data signal input lines in a one-to-one correspondence.

Optionally, the plurality of data signal input lines include first data signal input lines and second data signal input lines which are alternately arranged;

at least one of the sub-pixels includes a thin film transistor and a storage capacitor;

the thin film transistor includes an active layer located on the substrate, a gate located at a side, away from the substrate, of the active layer, a first insulating layer located at a side, away from the substrate, of the gate, a second insulating layer located at a side, away from the substrate, of the first insulating layer, and a source and a drain which are located at a side, away from the substrate, of the second insulating layer;

the storage capacitor includes a first polar plate and a second polar plate; the first polar plate is located in the same layer as the gate; the second polar plate is located between the first insulating layer and the second insulating layer;

the first data signal input lines are located in the same layer as the gate; and the second data signal input lines are located in the same layer as the second polar plate.

Optionally, the array substrate further includes: a source through-hole of the first multiplexed switch, located in the peripheral region; the first connecting portion and the second connecting portion are electrically connected to the active layer of the first multiplexed switch via the source through-hole of the first multiplexed switch.

Optionally, the array substrate further includes: a drain through-hole of second multiplexed switch, located in the peripheral region; the first connecting portion is electrically connected to the active layer of the second multiplexed switch via the drain through-hole of the second multiplexed switch.

Optionally, the array substrate further includes: a drain through hole of the third multiplexed switch, located in the peripheral region; the second connecting portion are electrically connected to the active layer of the third multiplexed switch via the drain through hole of the third multiplexed switch.

Optionally, the plurality of data signal transmission lines include a first data signal transmission line and a second data signal transmission line which are alternately arranged;

at least one of the sub-pixels includes a thin film transistor and a storage capacitor;

the thin film transistor includes an active layer located on the substrate, a gate located at a side, away from the substrate, of the active layer, a first insulating layer located at a side, away from the substrate, of the gate, a second insulating layer located at a side, away from the substrate, of the first insulating layer, and a source and a drain which are located at a side, away from the substrate, of the second insulating layer;

the storage capacitor includes a first polar plate and a second polar plate; the first polar plate is located in the same layer as the gate; the second polar plate is located between the first insulating layer and the second insulating layer;

the first data signal transmission lines are located in the same layer as the gate; and the second data signal transmission lines are located in the same layer as the second polar plate.

Illustratively, the structure and relevant content of the test circuit 14 provided in the embodiment of the present application are described hereafter; and the descriptions hereafter apply to the array substrate as shown in any one of FIG. 2, 5, or 8.

Figure 11:
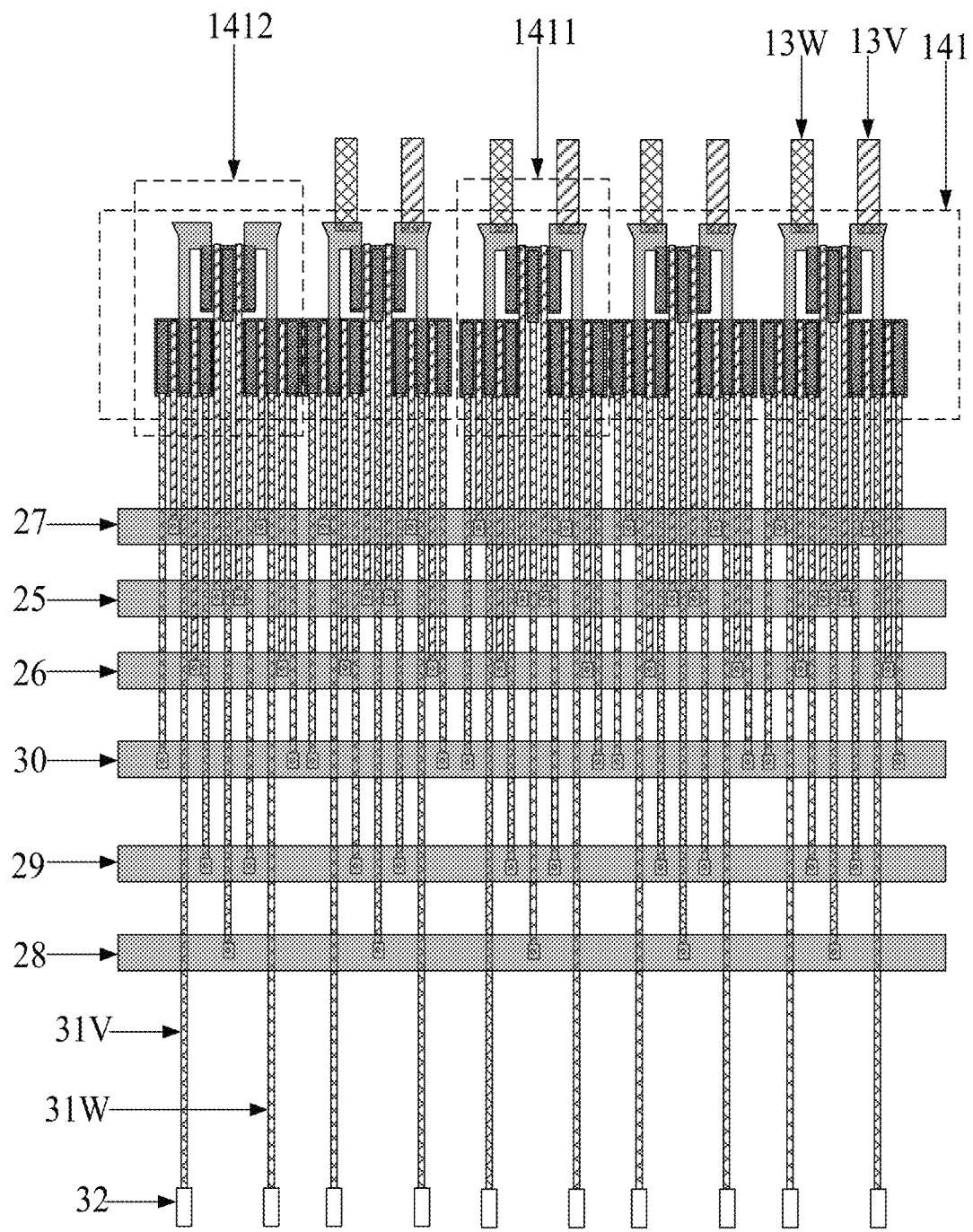
FIG. 11 is an enlarged view of a partial region of FIG. 3, 6 or 9.
Figure 12:
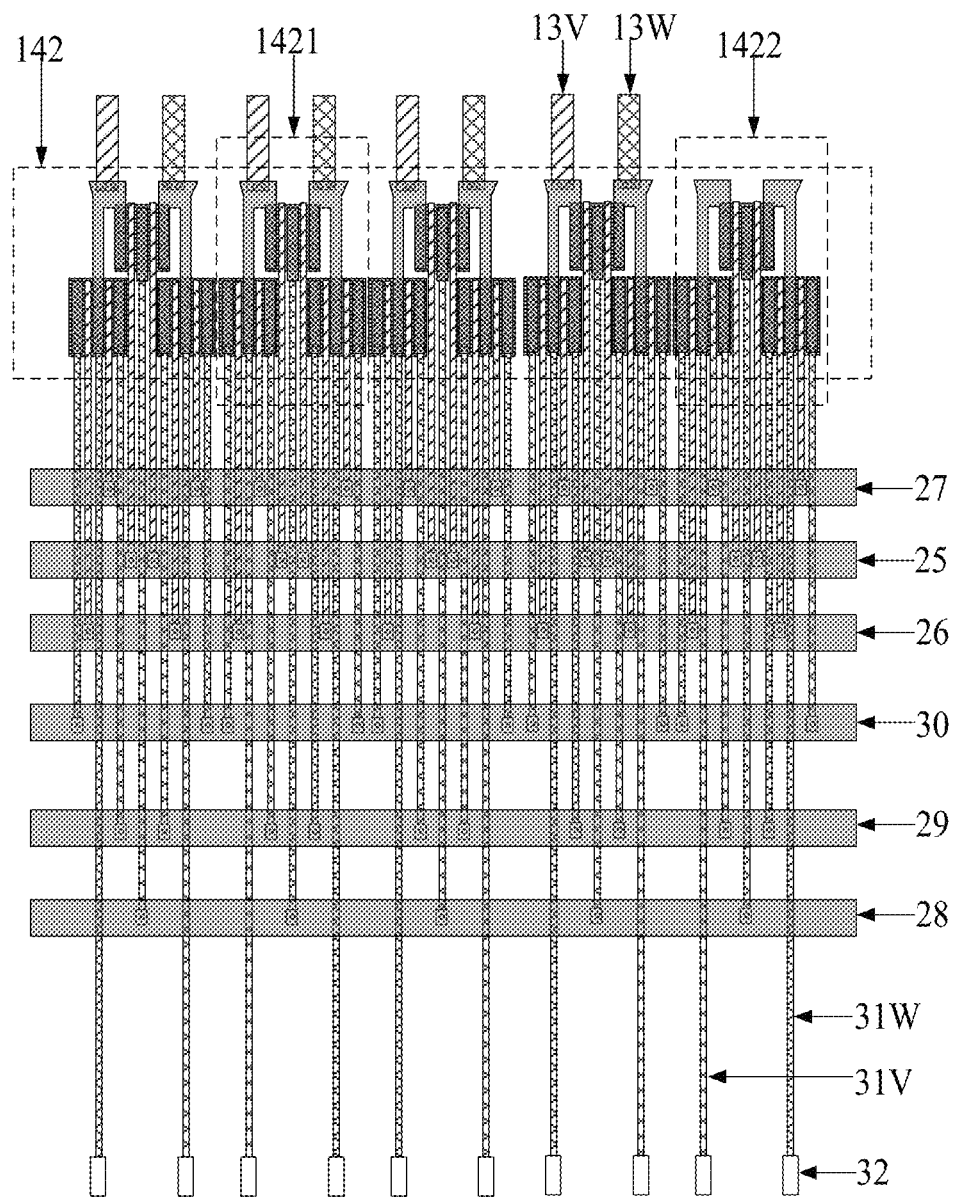
FIG. 12 is an enlarged view of another partial region of FIG. 3, 6 or 9.

Optionally, FIG. 11 is an enlarged view of a partial region of FIG. 3, 6 or 9; FIG. 12 is an enlarged view of another partial region of FIG. 3, 6 or 9; with reference to FIGS. 11, 12 and 3, 6, and 9, in the test circuit 14, the first portion 141 includes a first effective test sub-circuit 1411 and a first redundant test sub-circuit 1412; the second portion 142 includes a second effective test sub-circuit 1421 and a second redundant test sub-circuit 1422; the first effective test sub-circuit 1411 is located between the first redundant test sub-circuit 1412 and the second portion 142; and the second effective test sub-circuit 1421 is located between the second redundant test sub-circuit 1422 and the first portion 141. It would be easy to understand that the redundant test sub-circuits are located on the two sides of the effective test sub-circuits.

Optionally, with reference to FIGS. 11, 12 and 3, 6, or 9, each first effective test sub-circuit 1411 is electrically connected to two data signal transmission lines; and each second effective test sub-circuit 1421 is electrically connected two data signal transmission lines. None of the redundant test sub-circuits is electrically connected to the data signal transmission line. It would be easy to understand that FIGS. 3, 6, 9, 11 and 12 are only illustrative; in practical use, the first redundant test sub-circuit 1412 and the second redundant test sub-circuit 1422 can be respectively electrically connected to at least one data signal transmission line; alternatively, a part of the first redundant test sub-circuit 1412 and the second redundant test sub-circuit 1422 are electrically connected to at least one data signal transmission line, and the other part of redundant test sub-circuits are not electrically connected to the data signal transmission line, which is not limited by the embodiments of the present application.

Figure 13:
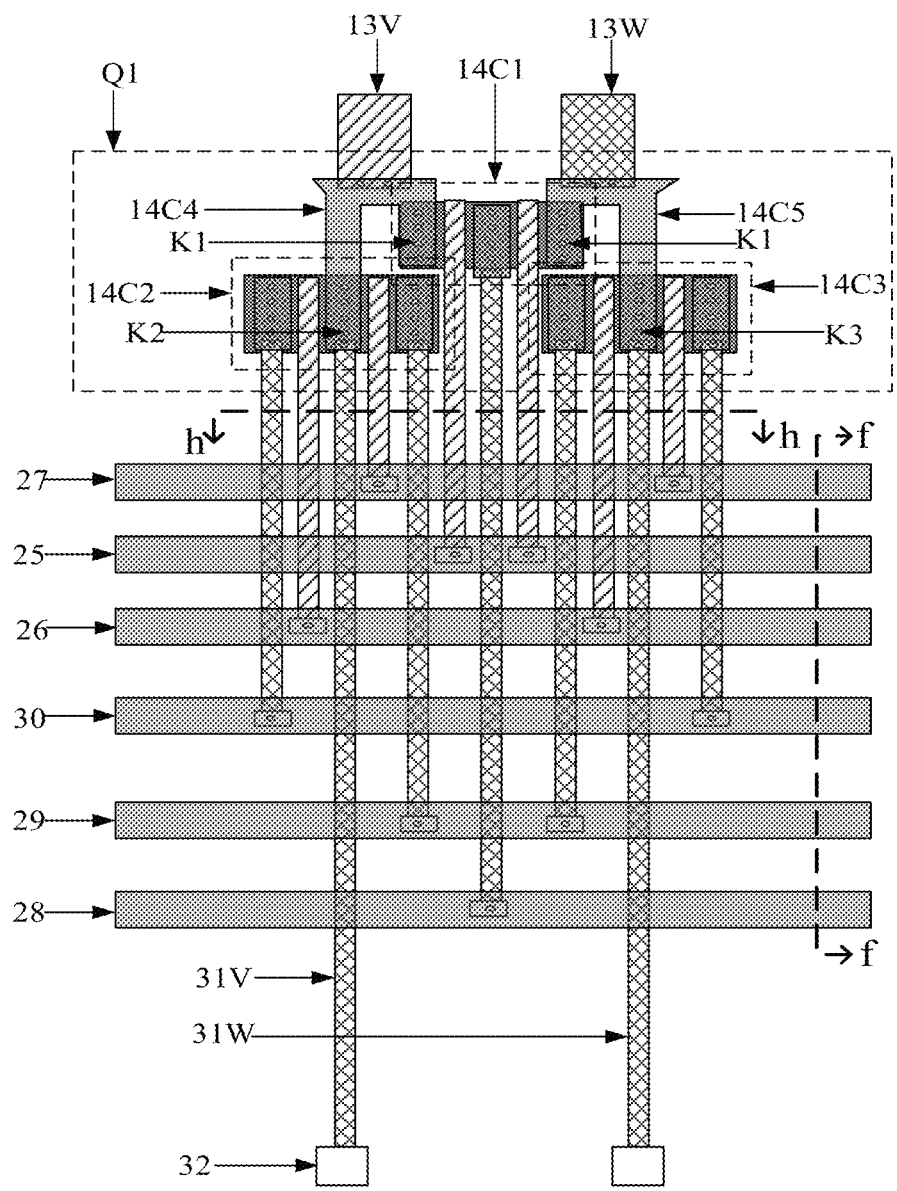
FIG. 13 is an enlarged view of a partial region of FIG. 3, 6 or 9.

Optionally, FIG. 13 shows an enlarged view of a partial region of FIG. 3, 6 or 9; with reference to FIGS. 13 and 2-12, the test sub-circuit 14C includes a first multiplexed switch 14C1, a second multiplexed switch 14C2, a third multiplexed switch 14C3, a first connecting portion 14C4, and a second connecting portion 14C5; the second multiplexed switch 14C2 and the third multiplexed switch 14C3 are respectively located at a side, away from the display region B1, of the first multiplexed switch 14C1; the plurality of sub-pixels 11 include a plurality of first sub-pixels, a plurality of second sub-pixels and a plurality of third sub-pixels; the first sub-pixels, the second sub-pixels, and the third sub-pixels may include red sub-pixels, green sub-pixels, and blue sub-pixels, for example, the first sub-pixels are green sub-pixels; the second sub-pixels are blue sub-pixels; and the third sub-pixels are red sub-pixels.

With reference to FIGS. 13 and 2012, the first multiplexed switch 14C1 is located at a side, away from the display region B1, of the plurality of data signal transmission lines; the first multiplexed switch 14C1 is respectively electrically connected to the first connecting portion 14C4 and the second connecting portion 14C5, and is used to transmit a data signal of one first sub-pixel to the data signal transmission line via the first connecting portion 14C4 and the second connecting portion 14C5 in different time periods, and transmit, via different data signal transmission lines, the data signal to other first sub-pixels electrically connected to different data lines. Illustratively, the first multiplexed switch 14C1 is used to transmit, via the first connecting portion 14C4, a data signal of one first sub-pixel to the data signal transmission line electrically connected to the first connecting portion 14C4, and transmit, via the data signal transmission line, the data signal to the data line 12 electrically connected to the data signal transmission line, such that the data line 12 can transmit the data signal to other first sub-pixels electrically connected to the data line; the first multiplexed switch 14C1 is used to transmit, via the second connecting portion 14C5, a data signal of one first sub-pixel to the data signal transmission line electrically connected to the second connecting portion 14C5, and transmit, via the data signal transmission line, the data signal to the data line 12 electrically connected to the data signal transmission line, such that the data line 12 can transmit the data signal to other first sub-pixels electrically connected to the data line; the data signal transmission process of the first multiplexed switch 14C1 via the first connecting portion 14C4 and the data signal transmission process of the first multiplexed switch 14C1 via the second connecting portion 14C5 occur in different time periods.

With reference to FIGS. 13 and 2-12, the second multiplexed switch 14C2 is electrically connected to the first connecting portion 14C4, and is used to transmit a data signal of one second sub-pixel or a data signal of one third sub-pixel to the data signal transmission line via the first connecting portion 14C4 in different time periods, and transmit, via the data signal transmission lines, the data signal to other second sub-pixels or other third sub-pixels electrically connected to the same data lines 12. Illustratively, the second multiplexed switch 14C2 is used to transmit, via the first connecting portion 14C4, a data signal of one second sub-pixel to the data signal transmission line, and transmit, via the data signal transmission line, the data signal to other second sub-pixels electrically connected to the same data line 12; the second multiplexed switch 14C2 is used to transmit, via the first connecting portion 14C4, a data signal of one third sub-pixel to the data signal transmission line, and transmit, via the data signal transmission line, the data signal to other third sub-pixels electrically connected to the same data line 12; the process of transmitting the data signal of the second sub-pixel by the second multiplexed switch 14C2 and the process of transmitting the data signal of the third sub-pixel by the second multiplexed switch 14C2 occur in different time periods.

With reference to FIGS. 13 and 3-12, the third multiplexed switch 14C3 is electrically connected to the second connecting portion 14C5, and is used to transmit a data signal of one second sub-pixel or a data signal of one third sub-pixel to the data signal transmission line via the second connecting portion 14C5 in different time periods, and transmit, via the data signal transmission lines, the data signal to other second sub-pixels or other third sub-pixels electrically connected to the same data lines 12. Illustratively, the third multiplexed switch 14C3 is used to transmit, via the second connecting portion 14C5, a data signal of one second sub-pixel to the data signal transmission line, and transmit, via the data signal transmission line, the data signal to other second sub-pixels electrically connected to the same data line 12; the third multiplexed switch 14C3 is used to transmit, via the second connecting portion 14C5, a data signal of one third sub-pixel to the data signal transmission line, and transmit, via the data signal transmission line, the data signal to other third sub-pixels electrically connected to the same data line 12; the process of transmitting the data signal of the second sub-pixel by the third multiplexed switch 14C3 and the process of transmitting the data signal of the third sub-pixel by the third multiplexed switch 14C3 occur in different time periods.

Figure 14:
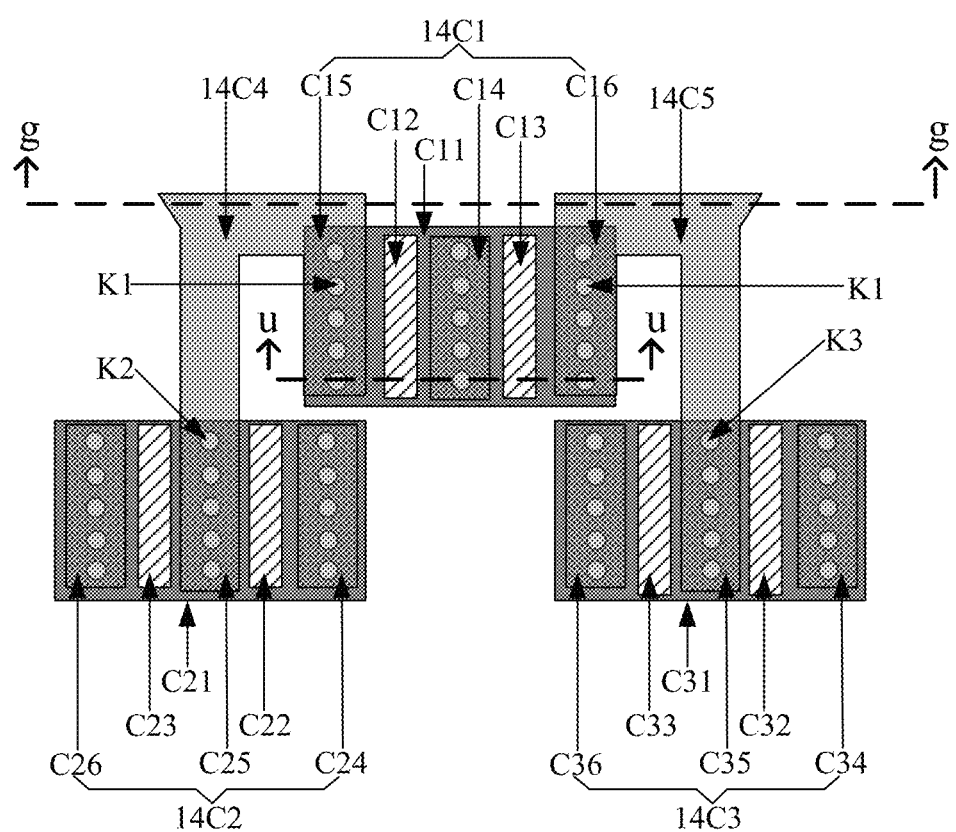
FIG. 14 is a schematic structural diagram of a test sub-circuit provided by an embodiment of the present application.
Figure 15:
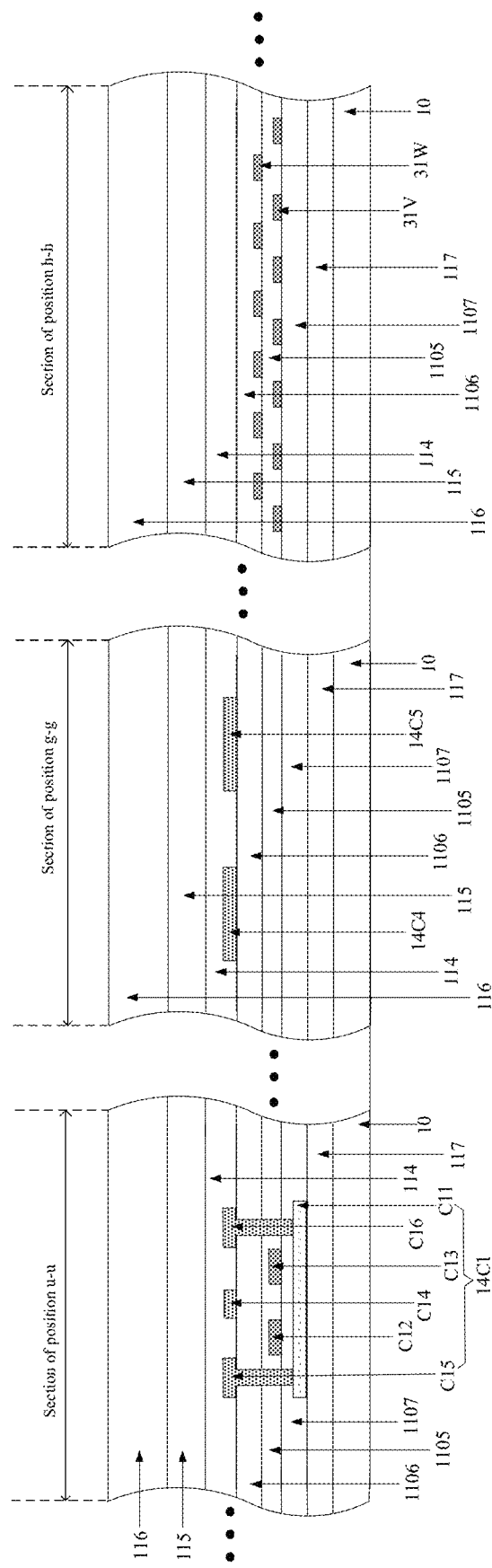
FIG. 15 is a sectional view of positions u-u and g-g as shown in FIG. 14 and position h-h as shown in FIG. 13.

Optionally, with reference to FIGS. 14 and 15, FIG. 14 shows a schematic structural diagram of a test sub-circuit 14C provided by an embodiment of the present application, and FIG. 15 shows a sectional view of positions u-u and g-g as shown in FIG. 14 and position h-h as shown in FIG. 13. With reference to FIGS. 14 and 15, The first multiplexed switch 14C1 includes: an active layer C11 of the first multiplexed switch located on the substrate 10; a first gate C12 of the first multiplexed switch and a second gate C13 of the first multiplexed switch which are located at a side, away from the substrate 10, of the active layer C11 of the first multiplexed switch, an orthographic projection of the first gate C12 of the first multiplexed switch on the substrate 10 staggering from an orthographic projection of the second gate C13 of the first multiplexed switch on the substrate 10; a first source C14 of the first multiplexed switch, a first drain C15 of the first multiplexed switch, and a second drain C16 of the first multiplexed switch which are located at a side, away from the substrate 10, of the first gate C12 of the first multiplexed switch and the second gate C13 of the first multiplexed switch, wherein the source C14 of the first multiplexed switch is located between the first drain C15 of the first multiplexed switch and the second drain C16 of the first multiplexed switch; the orthographic projection of the first gate C12 of the first multiplexed switch on the substrate 10 falls between orthographic projections of the first drain C15 of the first multiplexed switch and the source C14 of the first multiplexed switch on the substrate 10; and the orthographic projection of the second gate C13 of the first multiplexed switch on the substrate 10 falls between orthographic projections of the second drain C16 of the first multiplexed switch and the source C14 of the first multiplexed switch on the substrate 10.

With reference to FIG. 14, the second multiplexed switch 14C2 includes: an active layer C21 of the second multiplexed switch located on the substrate 10; a first gate C22 of the second multiplexed switch and a second gate C23 of the second multiplexed switch which are located at a side, away from the substrate 10, of the active layer C21 of the second multiplexed switch, an orthographic projection of the first gate C22 of the second multiplexed switch on the substrate 10 staggering from an orthographic projection of the second gate C23 of the second multiplexed switch on the substrate 10; a first source C24 of the second multiplexed switch, a drain C25 of the second multiplexed switch, and a second source C26 of the second multiplexed switch which are located at a side, away from the substrate 10, of the first gate C22 of the second multiplexed switch and the second gate C23 of the second multiplexed switch, wherein the drain C25 of the second multiplexed switch is located between the first source C24 of the second multiplexed switch and the second source C26 of the second multiplexed switch; the orthographic projection of the first gate C22 of the second multiplexed switch on the substrate 10 falls between orthographic projections of the first source C24 of the second multiplexed switch and the drain C25 of the second multiplexed switch on the substrate 10; and the orthographic projection of the second gate C23 of the second multiplexed switch on the substrate 10 falls between orthographic projections of the second drain C25 of the second multiplexed switch and the second source C26 of the second multiplexed switch on the substrate 10. It should be noted that the section of the second multiplexed switch 14C2 can refer to the section of the first multiplexed switch 14C1 in FIG. 15. Therefore, the sectional view of the second multiplexed switch 14C2 is not drawn.

With reference to FIG. 14, the third multiplexed switch 14C3 includes: an active layer C31 of the third multiplexed switch located on the substrate 10; a first gate C32 of the third multiplexed switch and a second gate C33 of the third multiplexed switch which are located at a side, away from the substrate 10, of the active layer C31 of the third multiplexed switch, an orthographic projection of the first gate C32 of the third multiplexed switch on the substrate 10 staggering from an orthographic projection of the second gate C33 of the third multiplexed switch on the substrate 10;

a first source C34 of the third multiplexed switch, a drain C35 of the third multiplexed switch, and a second source C36 of the third multiplexed switch which are located at a side, away from the substrate 10, of the first gate C32 of the third multiplexed switch and the second gate C33 of the third multiplexed switch, wherein the drain C35 of the third multiplexed switch is located between the first source C34 of the third multiplexed switch and the second source C36 of the third multiplexed switch; the orthographic projection of the first gate C32 of the third multiplexed switch on the substrate 10 falls between orthographic projections of the first source C34 of the third multiplexed switch and the drain C35 of the third multiplexed switch on the substrate 10; and the orthographic projection of the second gate C33 of the third multiplexed switch on the substrate 10 falls between orthographic projections of the drain C35 of the third multiplexed switch and the second source C36 of the third multiplexed switch on the substrate 10. It should be noted that the section of the third multiplexed switch 14C3 can refer to the section of the first multiplexed switch 14C1 in FIG. 15. Therefore, the sectional view of the third multiplexed switch 14C3 is not drawn.

Optionally, in the embodiment of the present application, the first multiplexed switch 14C1 further includes: a first insulating layer of the first multiplexed switch located at a side, away from the substrate 10, of the first gate C12 of the first multiplexed switch and the second gate C13 of the first multiplexed switch; a second insulating layer of the first multiplexed switch located at a side, away from the substrate 10, of the first insulating layer of the first multiplexed switch, the source C14 of the first multiplexed switch, the first drain C15 of the first multiplexed switch, and the second drain C16 of the first multiplexed switch being all located at a side, away from the substrate 10, of the second insulating layer of the first multiplexed switch; and a third insulating layer of the first multiplexed switch located between the active layer C11 of the first multiplexed switch and the first gate C12 and the second gate C13 of the first multiplexed switch; the second insulating layer of the first multiplexed switch, the first insulating layer of the first multiplexed switch, and the third insulating layer of the first multiplexed switch are provided with a source through-hole of the first multiplexed switch, a first drain through-hole of the first multiplexed switch, and a second drain through-hole of the first multiplexed switch; the source C14 of the first multiplexed switch is electrically connected to the active layer C11 of the first multiplexed switch via the source through-hole of the first multiplexed switch; the first drain C15 of the first multiplexed switch is electrically connected to the active layer C11 of the first multiplexed switch via the first drain through-hole of the first multiplexed switch; and the second drain C16 of the first multiplexed switch is electrically connected to the active layer C11 of the first multiplexed switch via the second drain through-hole of the first multiplexed switch. The second multiplexed switch 14C2 further includes: a first insulating layer of the second multiplexed switch located at a side, away from the substrate 10, of the first gate C22 of the second multiplexed switch and the second gate C23 of the second multiplexed switch; a second insulating layer of the second multiplexed switch located at a side, away from the substrate 10, of the first insulating layer of the second multiplexed switch, the first source C24 of the second multiplexed switch, the drain C25 of the second multiplexed switch, and the second source C26 of the second multiplexed switch being all located at a side, away from the substrate 10, of the second insulating layer of the second multiplexed switch; and a third insulating layer of the second multiplexed switch located between the active layer C21 of the second multiplexed switch and the first gate C22 and the second gate C23 of the second multiplexed switch; the second insulating layer of the second multiplexed switch, the first insulating layer of the second multiplexed switch, and the third insulating layer of the second multiplexed switch are provided with a first source through-hole of the second multiplexed switch, a drain through-hole of the second multiplexed switch, and a second source through-hole of the second multiplexed switch; the first source C24 of the second multiplexed switch is electrically connected to the active layer C21 of the second multiplexed switch via the first source through-hole of the second multiplexed switch; the drain C25 of the second multiplexed switch is electrically connected to the active layer C21 of the second multiplexed switch via the drain through-hole of the second multiplexed switch; and the second source C26 of the second multiplexed switch is electrically connected to the active layer C21 of the second multiplexed switch via the second source through-hole of the second multiplexed switch. The third multiplexed switch 14C3 further includes: a first insulating layer of the third multiplexed switch located at a side, away from the substrate 10, of the first gate C32 of the third multiplexed switch and the second gate C33 of the third multiplexed switch; a second insulating layer of the third multiplexed switch located at a side, away from the substrate 10, of the first insulating layer of the third multiplexed switch, the first source C34 of the third multiplexed switch, the drain C35 of the third multiplexed switch, and the second source C36 of the third multiplexed switch being all located at a side, away from the substrate 10, of the second insulating layer of the third multiplexed switch; and a third insulating layer of the third multiplexed switch located between the active layer C31 of the third multiplexed switch and the first gate C32 and the second gate C33 of the third multiplexed switch; the second insulating layer of the third multiplexed switch, the first insulating layer of the third multiplexed switch, and the third insulating layer of the third multiplexed switch are provided with a first source through-hole of the third multiplexed switch, a drain through-hole of the third multiplexed switch, and a second source through-hole of the third multiplexed switch; the first source C34 of the third multiplexed switch is electrically connected to the active layer C31 of the third multiplexed switch via the first source through-hole of the third multiplexed switch; the drain C35 of the third multiplexed switch is electrically connected to the active layer C31 of the third multiplexed switch via the drain through-hole of the third multiplexed switch; and the second source C36 of the third multiplexed switch is electrically connected to the active layer C31 of the third multiplexed switch via the second source through-hole of the third multiplexed switch. Optionally, in the embodiment of the present application, the active layer C11 of the first multiplexed switch, the active layer C21 of the second multiplexed switch, and the active layer C31 of the third multiplexed switch can be located in the same layer as the active layer 1101 of the sub-pixel 11; the first gate C12 of the first multiplexed switch, the second gate C13 of the first multiplexed switch, the first gate C22 of the second multiplexed switch, the second gate C23 of the second multiplexed switch, the first gate C32 of the third multiplexed switch, and the second gate C33 of the third multiplexed switch can be located in the same layer as the gate 1102 of the sub-pixel 11; the source C14 of the first multiplexed switch, the first drain C15 of the first multiplexed switch, the second drain C16 of the first multiplexed switch, the first source C24 of the second multiplexed switch, the drain C25 of the second multiplexed switch, the second source C26 of the second multiplexed switch, the first source C34 of the third multiplexed switch, the drain C35 of the third multiplexed switch, and the second source C36 of the third multiplexed switch can be located in the same layer as the source 1103 and the drain 1104 of the sub-pixel 11; the first insulating layer of the first multiplexed switch; the first insulating layer of the second multiplexed switch, and the first insulating layer of the third multiplexed switch can be respectively a part, formed by extending to the peripheral region B2, of the first insulating layer 1105 of the sub-pixel 11 in the display region B1; the second insulating layer of the first multiplexed switch; the second insulating layer of the second multiplexed switch, and the second insulating layer of the third multiplexed switch can be respectively a part, formed by extending to the peripheral region B2, of the second insulating layer 1106 of the sub-pixel 11 in the display region B1; the third insulating layer of the first multiplexed switch; the third insulating layer of the second multiplexed switch, and the third insulating layer of the third multiplexed switch can be respectively a part, formed by extending to the peripheral region B2, of the third insulating layer 1107 of the sub-pixel 11 in the display region B1. Furthermore, in the embodiment of the present application, the first insulating layer 1105 and the third insulating layer 1107 can be both gate insulating layers; and the second insulating layer 1106 can be an interlayer insulating layer.

Optionally, as shown in FIG. 15, the first connecting portion 14C4 and the second connecting portion 14C5 are both located in the same layer as the source C14 of the first multiplexed switch, the first drain C15 of the first multiplexed switch, and the second drain C16 of the first multiplexed switch; since the source C14 of the first multiplexed switch, the first drain C15 of the first multiplexed switch, and the second drain C16 of the first multiplexed switch are located in the same layer as the source 1103 of the sub-pixel 11, the first connecting portion 14C4 and the second connecting portion 14C5 are both located in the same layer as the source 1103.

Optionally, still with reference to FIGS. 3, 6, 9, and 11-13, the array substrate further includes:

a plurality of data signal input lines, located in the peripheral region B2, the plurality of data signal input lines including first data signal input lines 31V and second data signal input lines 31W which are alternately arranged, and the plurality of data signal input lines being respectively electrically connected to the first connecting portion 14C4 and the second connecting portion 14C5 via the second multiplexed switch 14C2 and the third multiplexed switch 14C3; and a plurality of signal input terminals 32, located in the peripheral region B2 and at a side, away from the display region B1, of the plurality of data signal input lines, the plurality of signal input terminals 32 being electrically connected to the plurality of data signal input lines in a one-to-one correspondence, wherein the signal input terminal 32 can be a chip-on-film (COF) pin. Optionally, with reference to FIGS. 15 and 7, the first data signal transmission lines 31V is located in the same layer as the gate 1102; in the embodiment of the present application, the second data signal transmission lines 31W is located in the same layer as the second polar plate 1112 of the storage capacitor 111.

Optionally, still with reference to FIGS. 13, 14 and 3, 6, 9, 11, and 12, the array substrate further includes: a source through-hole K1 of the first multiplexed switch, located in the peripheral region B2, the first connecting portion 14C4 and the second connecting portion 14C5 being electrically connected to the active layer C11 of the first multiplexed switch via the source through-hole K1 of the first multiplexed switch; a drain through-hole K2 of the second multiplexed switch, located in the peripheral region B2, the first connecting portion 14C4 being electrically connected to the active layer C21 of the second multiplexed switch via the drain through-hole K2 of the second multiplexed switch; and a drain through-hole K3 of the third multiplexed switch, located in the peripheral region B2, the second connecting portion 14C5 being electrically connected to the active layer C31 of the third multiplexed switch via the drain through-hole K3 of the third multiplexed switch.

Optionally, still with reference to FIGS. 3, 6, 9, and 11-13, the array substrate further includes:

a plurality of test control lines arranged in parallel, and located in the peripheral region B2 and at a side, away from the display region B1, of the second multiplexed switch 14C2 and the third multiplexed switch 14C3; the plurality of test control lines include a first sub-pixel gate control line 25, a second sub-pixel gate control line 26, a third sub-pixel gate control line 27, a first sub-pixel data control line 28, a second sub-pixel data control line 29, and a third sub-pixel data control line 30. The first sub-pixel gate control line 25 is electrically connected to the first gate C12 of the first multiplexed switch and the second gate C13 of the first multiplexed switch; the second sub-pixel gate control line 26 is electrically connected to the second gate C23 of the second multiplexed switch and the second gate C33 of the third multiplexed switch; the third sub-pixel gate control line 27 is electrically connected to the first gate C22 of the second multiplexed switch and the first gate C32 of the third multiplexed switch; the first sub-pixel data control line 28 is electrically connected to the source C14 of the first multiplexed switch; the second sub-pixel data control line 29 is respectively electrically connected to the first source C24 of the second multiplexed switch and the second source C36 of the third multiplexed switch; and the third sub-pixel data control line 30 is respectively electrically connected to the second source C26 of the second multiplexed switch and the first source C34 of the third multiplexed switch.

Figure 16:
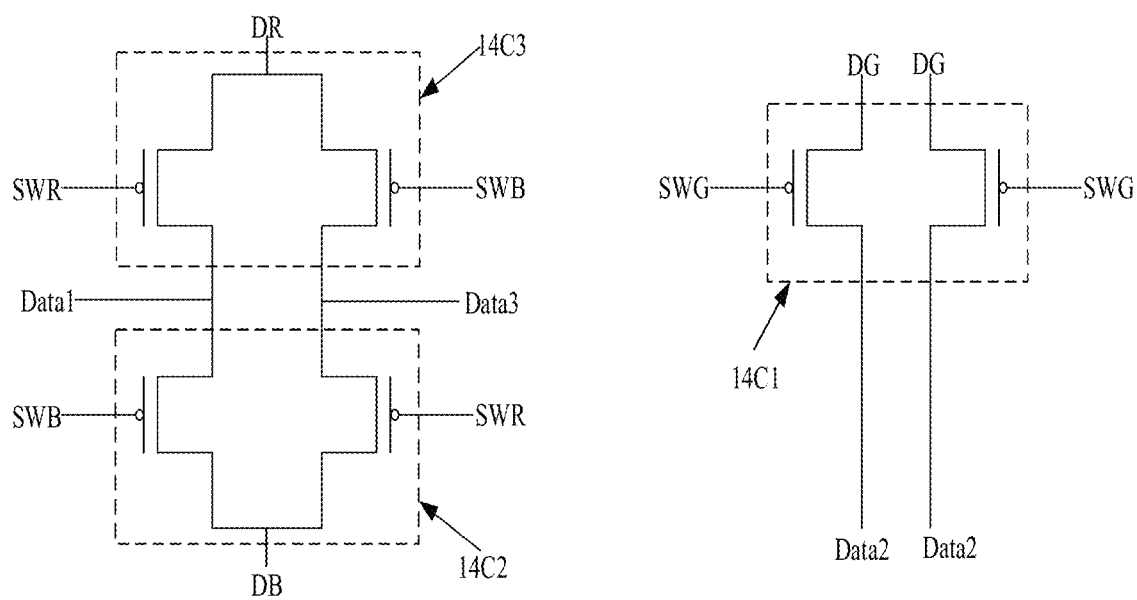
FIG. 16 is an equivalent circuit diagram of a test sub-circuit provided by an embodiment of the present application.

In the embodiment of the present application, the first sub-pixel gate control line 25 is used to transmit a first sub-pixel gate control signal SWG to the first gate C12 of the first multiplexed switch and the second gate C13 of the first multiplexed switch; the second sub-pixel gate control line 26 is used to transmit a second sub-pixel gate control signal SWB to the second gate C23 of the second multiplexed switch and the second gate C33 of the third multiplexed switch; the third sub-pixel gate control line 27 is used to transmit a third sub-pixel gate control signal SWR to the first gate C22 of the second multiplexed switch and the first gate C32 of the third multiplexed switch; the first sub-pixel data control line 28 is used to transmit a first sub-pixel data signal DG to the source C14 of the first multiplexed switch; the second sub-pixel data control line 29 is used to transmit a second sub-pixel data signal DB to the first source C24 of the second multiplexed switch and the second source C36 of the third multiplexed switch; and the third sub-pixel data control line 30 is used to transmit a third sub-pixel data signal DR to the second source C26 of the second multiplexed switch and the first source C34 of the third multiplexed switch. Optionally, with reference to FIG. 16; FIG. 16 is an equivalent circuit diagram of a test sub-circuit 14C provided by an embodiment of the present application.

Figure 17:
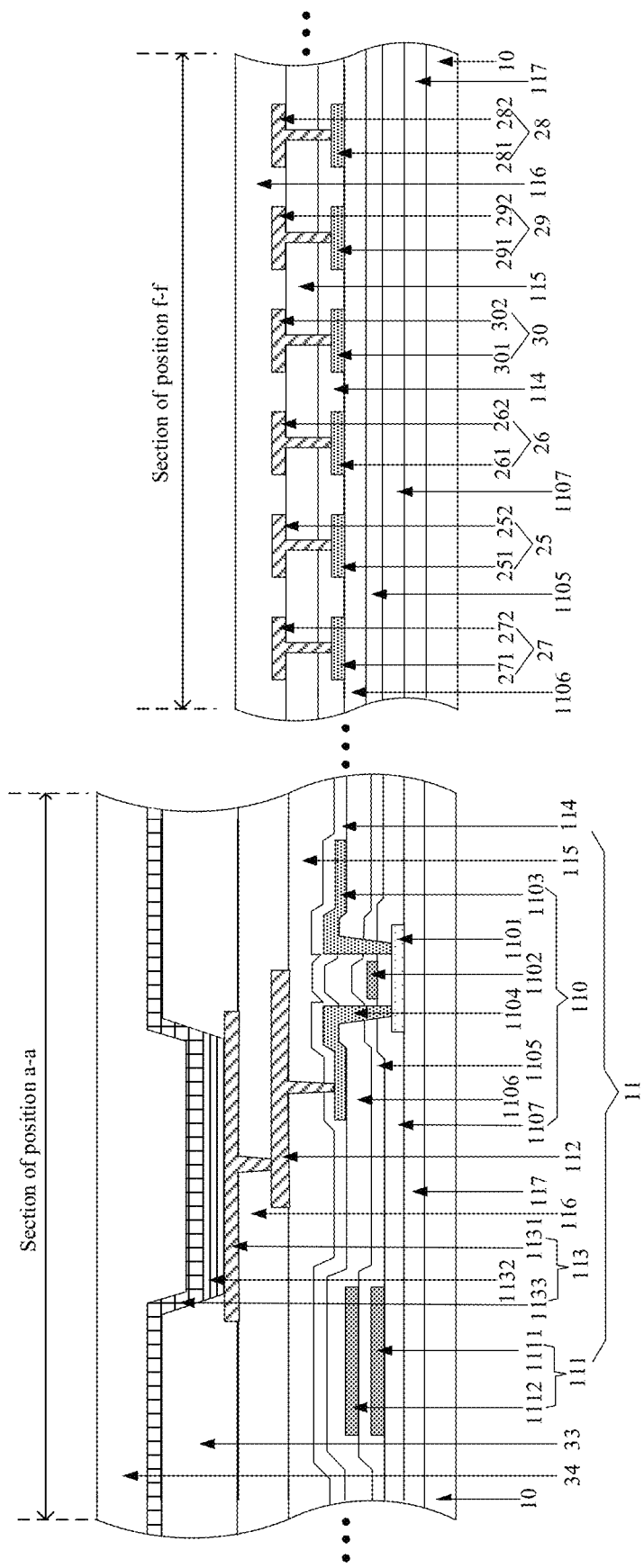
FIG. 17 is a sectional view of an array substrate provided by an embodiment of the present application.

Optionally, FIG. 17 shows a sectional view of an array substrate provided by an embodiment of the present application, and can be a sectional view of the position f-f in FIG.

13 and the position a-a of any one array substrate in FIG. 2, 5, or 8; with reference to FIG. 17, the first sub-pixel gate control line 25 includes a first sub-layer 251 of the first sub-pixel gate control line and a second sub-layer 252 of the first sub-pixel gate control line; the second sub-pixel gate control line 26 includes a first sub-layer 261 of the second sub-pixel gate control line and a second sub-layer 262 of the second sub-pixel gate control line; and the third sub-pixel gate control line 27 includes a first sub-layer 271 of the third sub-pixel gate control line and a second sub-layer 272 of the third sub-pixel gate control line; the first sub-pixel data control line 28 includes a first sub-layer 281 of the first sub-pixel data control line and a second sub-layer 282 of the first sub-pixel data control line; the second sub-pixel data control line 29 includes a first sub-layer 291 of the second sub-pixel data control line and a second sub-layer 292 of the second sub-pixel data control line; and the third sub-pixel data control line 30 includes a first sub-layer 301 of the third sub-pixel data control line and a second sub-layer 302 of the third sub-pixel data control line; the first sub-layer 251 of the first sub-pixel gate control line, the first sub-layer 261 of the second sub-pixel gate control line, the first sub-layer 271 of the third sub-pixel gate control line, the first sub-layer 281 of the first sub-pixel data control line, the first sub-layer 291 of the second sub-pixel data control line, and the first sub-layer 301 of the third sub-pixel data control line are located in the same layer; the second sub-layer 252 of the first sub-pixel gate control line, the second sub-layer 262 of the second sub-pixel gate control line, the second sub-layer 272 of the third sub-pixel gate control line, the second sub-layer 282 of the first sub-pixel data control line, the second sub-layer 292 of the second sub-pixel data control line, and the second sub-layer 302 of the third sub-pixel data control line are located in the same layer; furthermore, the layer that the first sub-layer 251 of the first sub-pixel gate control line, the first sub-layer 261 of the second sub-pixel gate control line, the first sub-layer 271 of the third sub-pixel gate control line, the first sub-layer 281 of the first sub-pixel data control line, the first sub-layer 291 of the second sub-pixel data control line, and the first sub-layer 301 of the third sub-pixel data control line are located is different from the layer that the second sub-layer 252 of the first sub-pixel gate control line, the second sub-layer 262 of the second sub-pixel gate control line, the second sub-layer 272 of the third sub-pixel gate control line, the second sub-layer 282 of the first sub-pixel data control line, the second sub-layer 292 of the second sub-pixel data control line, and the second sub-layer 302 of the third sub-pixel data control line are located; the first sub-layer 251 of the first sub-pixel gate control line and the second sub-layer 252 of the first sub-pixel gate control line are electrically connected via a first sub-pixel gate through-hole; the first sub-layer 261 of the second sub-pixel gate control line and the second sub-layer 262 of the second sub-pixel gate control line are electrically connected via a second sub-pixel gate through-hole; and the first sub-layer 271 of the third sub-pixel gate control line and the second sub-layer 272 of the third sub-pixel gate control line are electrically connected via a third sub-pixel gate through-hole; the first sub-layer 281 of the first sub-pixel data control line and the second sub-layer 282 of the first sub-pixel data control line are electrically connected via a first sub-pixel data through-hole; the first sub-layer 291 of the second sub-pixel data control line and the second sub-layer 292 of the second sub-pixel data control line are electrically connected via a second sub-pixel data through-hole; and the first sub-layer 301 of the third sub-pixel data control line and the second sub-layer 302 of the third sub-pixel data control line are electrically connected via a third sub-pixel data through-hole.

Optionally, as shown in FIG. 17, the first sub-layer 251 of the first sub-pixel gate control line, the first sub-layer 261 of the second sub-pixel gate control line, the first sub-layer 271 of the third sub-pixel gate control line, the first sub-layer 281 of the first sub-pixel data control line, the first sub-layer 291 of the second sub-pixel data control line, and the first sub-layer 301 of the third sub-pixel data control line are located in the same layer as the source 1103; the second sub-layer 252 of the first sub-pixel gate control line, the second sub-layer 262 of the second sub-pixel gate control line, the second sub-layer 272 of the third sub-pixel gate control line, the second sub-layer 282 of the first sub-pixel data control line, the second sub-layer 292 of the second sub-pixel data control line, and the second sub-layer 302 of the third sub-pixel data control line are located in the same layer as the connecting electrode 112.

It should be noted that the array substrate in the embodiment of the present application can be an electroluminescent display substrate, for example an organic light emitting diode (OLED); the array substrate can also be an array substrate in a liquid crystal display device, or other array substrates, which is not limited by the embodiment of the present application.

In summary, the embodiment of the present application provides an array substrate. The array substrate includes a first signal access terminal group, a second signal access terminal group, and a third signal access terminal group; the test circuit of the array substrate includes a first portion and a second portion; the first signal access terminal group is located at a side, away from the second portion, of the first portion; the second signal access terminal group is located between the first portion and the second portion; and the third signal access terminal group is located at a side, away from the first portion, of the second portion; furthermore, each one of the first signal access terminal group, the second signal access terminal group, and the third signal access terminal group is electrically connected to at least one of the first portion and the second portion; at least a part of the test sub-circuits of the test circuit are electrically connected to the plurality of data lines via at least two data signal transmission lines; that is, each one of the first signal access terminal group, the second signal access terminal group, and the third signal access terminal group is electrically connected to the data lines sequentially via the test circuit and the data signal transmission lines. Therefore, each signal access terminal group can be electrically connected to the data line close thereto via the data signal transmission line, such that the length and impedance of the data signal transmission line connected to each data line are both small, and the differences of the test signals received by the data lines are small, thus ensuring that the picture detection can be normally performed.

On the basis of the same inventive concept, the embodiment of the present application further provides a display device. The display device includes any one of the above array substrates. The display device provided by embodiments of the present application may be any one products or parts with a display function, such as a mobile phone, a tablet personal computer, a television, a display, a notebook computer, a digital photo frame, a navigator, etc.

In the embodiment of the present application, the term "the same layer" refers to a relationship between layers simultaneously formed in the same step. For example, when the first data signal transmission lines 13V and the gate 1102 are formed as the result of one or more steps for processing the same pattern in the same layer of material, the first data signal transmission lines 13V and the gate 1102 are located in the same layer; for another example, the first data signal transmission lines 13V and the gate 1102 can be formed by means of simultaneously executing formation steps of the first data signal transmission lines 13V and the gate 1102 in the same layer; "the same layer" does not always refer to that the layer thickness or layer height in a cross section view is the same.

The terms "first", "second", "third", "fourth" and similar words in the embodiment of the present application do not denote any sequence, quantity or importance, but are only used to differentiate different components. That two conductors are "electrically connected" refers to that the two conductors are directly or indirectly electrically connected, and can transmit an electrical signal. The term "at least one" refers to one or more, and the term "a plurality of" refers to two or more. "At least one of the following items" or similar expressions thereof refer to any combination of the items, including any combination consisting of a singular item or a plurality of items. For example, at least one of a, b or c can denote a, b, c, a+b, a+c, b+c, and a+b+c, wherein a, b, c can be singular items, and can also be a plurality of items.

It should be noted out that in the accompanying drawings, for clarity of the illustration, the dimensions of partial or all layers or partial or all regions may be scaled up. Furthermore, it may be understood that when an element or layer is described as being "above" another element or layer, the described element or layer may be directly on the other element, or an intermediate layer may be arranged between the described element or layer and the other element. In addition, it may be understood that when an element or layer is described as being "below" another element or layer, the described element or layer may be directly below the other element, or at least one intermediate layer or element may be arranged between the described element or layer and the other element. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals indicate like elements.

The foregoing is only exemplary embodiments of the present application and is not intended to be limiting of the present application, and any modifications, equivalent substitutions, improvements and the like within the spirit and principles of the present application are intended to be embraced by the protection range of the present application.

What is claimed is:

1. An array substrate, comprising:
    a substrate, comprising a display region and a peripheral region on at least one side of the display region;
    a plurality of sub-pixels, in the display region;
    a plurality of data lines, in the display region and electrically connected to the plurality of sub-pixels;
    a plurality of data signal transmission lines, in the peripheral region and electrically connected to the plurality of data lines;
    a test circuit, in the peripheral region and at a side, away from the display region, of the plurality of data signal transmission lines, and comprising a first portion and a second portion which are separated, wherein the first portion and the second portion respectively comprise at least one test sub-circuit, and each one of at least a part of the test sub-circuits is electrically connected to at least two data signal transmission lines, wherein
    the test sub-circuit comprises a first multiplexed switch, a second multiplexed switch, a third multiplexed switch, a first connecting portion, and a second connecting portion; and the second multiplexed switch and the third multiplexed switch are respectively at a side, away from the display region, of the first multiplexed switch;
    the first multiplexed switch is respectively electrically connected to the first connecting portion and the second connecting portion;
    the second multiplexed switch is electrically connected to the first connecting portion; and
    the third multiplexed switch is electrically connected to the second connecting portion;
    a first signal access terminal group, in the peripheral region and at a side, away from the second portion, of the first portion;
    a second signal access terminal group, in the peripheral region and between the first portion and the second portion; and
    a third signal access terminal group, in the peripheral region and at a side, away from the first portion, of the second portion;
    wherein each one of the first signal access terminal group, the second signal access terminal group, and the third signal access terminal group is electrically connected to at least one of the first portion and the second portion.

2. The array substrate according to claim 1, wherein the first signal access terminal group is electrically connected to the first portion; the second signal access terminal group is respectively electrically connected to the first portion and the second portion; and the third signal access terminal group is electrically connected to the second portion.

3. The array substrate according to claim 2, wherein the array substrate further comprises:
    a first connecting conduction line group, a second connecting conduction line group, and a third connecting conduction line group which are in the peripheral region;
    wherein the first signal access terminal group is electrically connected to the first portion via the first connecting conduction line group; the second signal access terminal group is electrically connected to the first portion and the second portion via the second connecting conduction line group; and the third signal access terminal group is electrically connected to the second portion via the third connecting conduction line group.

4. The array substrate according to claim 3, wherein
    at least one of the sub-pixels comprises a thin film transistor;
    the thin film transistor comprises an active layer on the substrate, a gate at a side, away from the substrate, of the active layer, and a source and a drain which are at a side, away from the substrate, of the gate; and
    the first connecting conduction line group, the second connecting conduction line group, and the third connecting conduction line group are all in the same layer as the source.

5. The array substrate according to claim 3, wherein the first signal access terminal group, the second signal access terminal group, and the third signal access terminal group respectively comprise a plurality of test terminals; and the first connecting conduction line group, the second connecting conduction line group, and the third connecting conduction line group respectively comprise a plurality of connecting conduction lines; and the connecting conduction lines are electrically connected to the test terminals in a one-to-one correspondence.

6. The array substrate according to claim 5, wherein at least one of the test terminals comprises a static electricity removal circuit and a contact pad; the static electricity removal circuit is between the contact pad and the connecting conduction lines.

7. The array substrate according to claim 1, wherein the array substrate further comprises:
a fourth signal access terminal group in the peripheral region; the fourth signal access terminal group is between the first portion and the second portion, and is between the second signal access terminal group and the third signal access terminal group; wherein the fourth signal access terminal group is electrically connected to at least one of the first portion and the second portion;
a first connecting conduction line group, a second connecting conduction line group, a third connecting conduction line group, and a fourth connecting conduction line group, which are in the peripheral region; wherein the first signal access terminal group is electrically connected to the first portion via the first connecting conduction line group; the second signal access terminal group is electrically connected to the first portion via the second connecting conduction line group; and the third signal access terminal group is electrically connected to the second portion via the third connecting conduction line group; and the fourth signal access terminal group is electrically connected to the second portion via the fourth connecting conduction line group; and
a bridging conduction line group connecting the first portion to the second portion; wherein the bridging conduction line group is in the peripheral region, and comprises a plurality of bridging conduction lines; at least one bridging conduction line comprises a first conduction line section, a second conduction line section, and a bridging section connecting the first conduction line section to the second conduction line section; wherein the first conduction line section is adjacent to the first portion; the second conduction line section is adjacent to the second portion; and the bridging section is in a region between the first portion and the second portion; wherein
at least one of the sub-pixels comprises a thin film transistor; the thin film transistor comprises an active layer on the substrate, a gate at a side, away from the substrate, of the active layer, and a source and a drain which are at a side, away from the substrate, of the gate; and the first connecting conduction line group, the second connecting conduction line group, the third connecting conduction line group, and the fourth connecting conduction line group are all in the same layer as the source; and
the first signal access terminal group and the second signal access terminal group are respectively electrically connected to the first portion; and the third signal access terminal group and the fourth signal access terminal group are respectively electrically connected to the second portion.

8. The array substrate according to claim 7, wherein
at least one of the sub-pixels comprises a thin film transistor and a storage capacitor;
the thin film transistor further comprises a first insulating layer at a side, away from the substrate, of the gate, a second insulating layer at a side, away from the substrate, of the first insulating layer, and a source and a drain which are at a side, away from the substrate, of the second insulating layer;
the storage capacitor comprises a first polar plate and a second polar plate; the first polar plate is in the same layer as the gate; the second polar plate is between the first insulating layer and the second insulating layer; and
the first conduction line section comprises a first sub-layer of the first conduction line section, and a second sub-layer of the first conduction line section; the second conduction line section comprises a first sub-layer of the second conduction line section and a second sub-layer of the second conduction line section; the bridging section, the first sub-layer of the first conduction line section, and the first sub-layer of the second conduction line section are in the same layer as the gate; the second sub-layer of the first conduction line section, and the second sub-layer of the second conduction line section are in the same layer as the second polar plate; the first sub-layer of the first conduction line section and the second sub-layer of the first conduction line section are electrically connected via a first conduction line through-hole; and the first sub-layer of the second conduction line section and the second sub-layer of second conduction line section are electrically connected via a second conduction line through-hole.

9. The array substrate according to claim 7, wherein
the first signal access terminal group, the second signal access terminal group, the third signal access terminal group, and the fourth signal access terminal group respectively comprise a plurality of test terminals; and
the first connecting conduction line group, the second connecting conduction line group, the third connecting conduction line group, and the fourth connecting conduction line group respectively comprise a plurality of connecting conduction lines; and the connecting conduction lines are electrically connected to the test terminals in a one-to-one correspondence; wherein
at least one of the test terminals comprises a static electricity removal circuit and a contact pad; the static electricity removal circuit is between the contact pad and the connecting conduction lines.

10. The array substrate according to claim 1, wherein
the first portion comprises a first effective test sub-circuit and a first redundant test sub-circuit; the second portion comprises a second effective test sub-circuit and a second redundant test sub-circuit; and
the first effective test sub-circuit is between the first redundant test sub-circuit and the second portion; and the second effective test sub-circuit is between the second redundant test sub-circuit and the first portion; and each first effective test sub-circuit is electrically connected to two data signal transmission lines; and each second effective test sub-circuit is electrically connected two data signal transmission lines.

11. The array substrate according to claim 1, wherein
the plurality of sub-pixels comprises a plurality of first sub-pixels, a plurality of second sub-pixels, and a plurality of third sub-pixels;

the first multiplexed switch is at a side, away from the display region, of the plurality of data signal transmission lines; the first multiplexed switch is used to transmit a data signal of one first sub-pixel to the data signal transmission lines via the first connecting portion and the second connecting portion in different time periods, and transmit, via the data signal transmission lines, the data signal to other first sub-pixels electrically connected to different data lines;

the second multiplexed switch is used to transmit a data signal of one of a second sub-pixel and a third sub-pixel to the data signal transmission lines via the first connecting portion in different time periods, and transmit, via the data signal transmission lines, the data signal to one of other second sub-pixels and other third sub-pixels electrically connected to the same data lines; and the third multiplexed switch is used to transmit a data signal of one of a second sub-pixel and a third sub-pixel to the data signal transmission lines via the second connecting portion in different time periods, and transmit, via the data signal transmission lines, the data signal to one of other second sub-pixels and other third sub-pixels electrically connected to the same data lines.

12. The array substrate according to claim 11, wherein the first multiplexed switch comprises:

an active layer of the first multiplexed switch on the substrate;

a first gate of the first multiplexed switch and a second gate of the first multiplexed switch which are at a side, away from the substrate, of the active layer of the first multiplexed switch, an orthographic projection of the first gate of the first multiplexed switch on the substrate staggering from an orthographic projection of the second gate of the first multiplexed switch on the substrate; and a source of the first multiplexed switch, a first drain of the first multiplexed switch, and a second drain of the first multiplexed switch which are at a side, away from the substrate, of the first gate of the first multiplexed switch and the second gate of the first multiplexed switch, wherein the source of the first multiplexed switch is between the first drain of the first multiplexed switch and the second drain of the first multiplexed switch;

wherein the orthographic projection of the first gate of the first multiplexed switch on the substrate falls between orthographic projections of the first drain of the first multiplexed switch and the source of the first multiplexed switch on the substrate; and the orthographic projection of the second gate of the first multiplexed switch on the substrate falls between orthographic projections of the second drain of the first multiplexed switch and the source of the first multiplexed switch on the substrate;

and, the second multiplexed switch comprises:

an active layer of the second multiplexed switch on the substrate;

a first gate of the second multiplexed switch and a second gate of the second multiplexed switch which are at a side, away from the substrate, of the active layer of the second multiplexed switch, an orthographic projection of the first gate of the second multiplexed switch on the substrate staggering from an orthographic projection of the second gate of the second multiplexed switch on the substrate; and a first source of the second multiplexed switch, a drain of the second multiplexed switch, and a second source of the second multiplexed switch which are at a side, away from the substrate, of the first gate of the second multiplexed switch and the second gate of the second multiplexed switch, wherein the drain of the second multiplexed switch is between the first source of the second multiplexed switch and the second source of the second multiplexed switch;

wherein the orthographic projection of the first gate of the second multiplexed switch on the substrate falls between orthographic projections of the first source of the second multiplexed switch and the drain of the second multiplexed switch on the substrate; and the orthographic projection of the second gate of the second multiplexed switch on the substrate falls between orthographic projections of the drain of the second multiplexed switch and the second source of the second multiplexed switch on the substrate;

and, the third multiplexed switch comprises:

an active layer of the third multiplexed switch on the substrate;

a first gate of the third multiplexed switch and a second gate of the third multiplexed switch which are at a side, away from the substrate, of the active layer of the third multiplexed switch, an orthographic projection of the first gate of the third multiplexed switch on the substrate staggering from an orthographic projection of the second gate of the third multiplexed switch on the substrate; and a first source of the third multiplexed switch, a drain of the third multiplexed switch, and a second source of the third multiplexed switch which are at a side, away from the substrate, of the first gate of the third multiplexed switch and the second gate of the third multiplexed switch, wherein the drain of the third multiplexed switch is between the first source of the third multiplexed switch and the second source of the third multiplexed switch;

wherein the orthographic projection of the first gate of the third multiplexed switch on the substrate falls between orthographic projections of the first source of the third multiplexed switch and the drain of the third multiplexed switch on the substrate; and the orthographic projection of the second gate of the third multiplexed switch on the substrate falls between orthographic projections of the drain of the third multiplexed switch and the second source of the third multiplexed switch on the substrate.

13. The array substrate according to claim 12, wherein the array substrate further comprises:

a plurality of test control lines arranged in parallel, and in the peripheral region and at a side, away from the display region, of the second multiplexed switch and the third multiplexed switch; and the plurality of test control lines comprise a first sub-pixel gate control line, a second sub-pixel gate control line, a third sub-pixel gate control line, a first sub-pixel data control line, a second sub-pixel data control line, and a third sub-pixel data control line;

the first sub-pixel gate control line is electrically connected to the first gate of the first multiplexed switch and the second gate of the first multiplexed switch; the second sub-pixel gate control line is electrically connected to the second gate of the second multiplexed switch and the second gate of the third multiplexed switch; the third sub-pixel gate control line is electrically connected to the first gate of the second multiplexed switch and the first gate of the third multiplexed switch; the first sub-pixel data control line is electrically connected to the source of the first multiplexed switch; the second sub-pixel data control line is respectively electrically connected to the first source of the second multiplexed switch and the second source of the third multiplexed switch; and the third sub-pixel data control line is respectively electrically connected to the second source of the second multiplexed switch and the first source of the third multiplexed switch.

14. The array substrate according to claim 13, wherein
the first sub-pixel gate control line comprises a first sub-layer of the first sub-pixel gate control line and a second sub-layer of the first sub-pixel gate control line; the second sub-pixel gate control line comprises a first sub-layer of the second sub-pixel gate control line and a second sub-layer of the second sub-pixel gate control line; and the third sub-pixel gate control line comprises a first sub-layer of the third sub-pixel gate control line and a second sub-layer of the third sub-pixel gate control line;

the first sub-pixel data control line comprises a first sub-layer of the first sub-pixel data control line and a second sub-layer of the first sub-pixel data control line; the second sub-pixel data control line comprises a first sub-layer of the second sub-pixel data control line and a second sub-layer of the second sub-pixel data control line; and the third sub-pixel data control line comprises a first sub-layer of the third sub-pixel data control line and a second sub-layer of the third sub-pixel data control line;

the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are in the same layer; the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are in the same layer; and, the layer that the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are is different from the layer that the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are;

the first sub-layer of the first sub-pixel gate control line and the second sub-layer of the first sub-pixel gate control line are electrically connected via a gate through-hole of the first sub-pixel; the first sub-layer of the second sub-pixel gate control line and the second sub-layer of the second sub-pixel gate control line are electrically connected via a gate through-hole of the second sub-pixel; and the first sub-layer of the third sub-pixel gate control line and the second sub-layer of the third sub-pixel gate control line are electrically connected via a gate through-hole of the third sub-pixel; and the first sub-layer of the first sub-pixel data control line and the second sub-layer of the first sub-pixel data control line are electrically connected via a data through-hole of the first sub-pixel; the first sub-layer of the second sub-pixel data control line and the second sub-layer of the second sub-pixel data control line are electrically connected via a data through-hole of the second sub-pixel; and the first sub-layer of the third sub-pixel data control line and the second sub-layer of the third sub-pixel data control line are electrically connected via a data through-hole of the third sub-pixel.

15. The array substrate according to claim 14, wherein
at least one of the sub-pixels comprises a thin film transistor and a connecting electrode;

the thin film transistor comprises an active layer on the substrate, a gate at a side, away from the substrate, of the active layer, and a source and a drain which are at a side, away from the substrate, of the gate; and the connecting electrode is at a side, away from the substrate, of the source;

the first sub-layer of the first sub-pixel gate control line, the first sub-layer of the second sub-pixel gate control line, the first sub-layer of the third sub-pixel gate control line, the first sub-layer of the first sub-pixel data control line, the first sub-layer of the second sub-pixel data control line, and the first sub-layer of the third sub-pixel data control line are in the same layer as the source;

the second sub-layer of the first sub-pixel gate control line, the second sub-layer of the second sub-pixel gate control line, the second sub-layer of the third sub-pixel gate control line, the second sub-layer of the first sub-pixel data control line, the second sub-layer of the second sub-pixel data control line, and the second sub-layer of the third sub-pixel data control line are in the same layer as the connecting electrode.

16. The array substrate according to claim 15, wherein
the first connecting portion and the second connecting portion are in the same layer as the source.

17. The array substrate according to claim 11, wherein the array substrate further comprises:
a plurality of data signal input lines, in the peripheral region; and the data signal input lines are respectively electrically connected to the first connecting portion and the second connecting portion via the second multiplexed switch and the third multiplexed switch; and a plurality of signal input terminals, in the peripheral region and at a side, away from the display region, of the plurality of data signal input lines; and the signal input terminals are electrically connected to the data signal input lines in a one-to-one correspondence; wherein the plurality of data signal input lines comprises first data signal input lines and second data signal input lines which are alternately arranged;

at least one of the sub-pixels comprises a thin film transistor and a storage capacitor;

the thin film transistor comprises an active layer on the substrate, a gate at a side, away from the substrate, of the active layer, a first insulating layer at a side, away from the substrate, of the gate, a second insulating layer at a side, away from the substrate, of the first insulating layer, and a source and a drain which are at a side, away from the substrate, of the second insulating layer;

the storage capacitor comprises a first polar plate and a second polar plate; the first polar plate is in the same layer as the gate; the second polar plate is between the first insulating layer and the second insulating layer; and the first data signal input lines are in the same layer as the gate; and the second data signal input lines are in the same layer as the second polar plate.

18. The array substrate according to claim 11, wherein the array substrate further comprises:

a source through-hole of the first multiplexed switch, in the peripheral region; wherein the first connecting portion and the second connecting portion are electrically connected to the active layer of the first multiplexed switch via the source through-hole of the first multiplexed switch;

a drain through-hole of the second multiplexed switch, in the peripheral region; wherein the first connecting portion is electrically connected to the active layer of the second multiplexed switch via the drain through-hole of the second multiplexed switch; and a drain through-hole of the third multiplexed switch, in the peripheral region; wherein the second connecting portion is electrically connected to the active layer of the third multiplexed switch via the drain through-hole of the third multiplexed switch.

19. The array substrate according to claim 1, wherein the plurality of data signal transmission lines comprises first data signal transmission lines and second data signal transmission lines which are alternately arranged;

at least one of the sub-pixels comprises a thin film transistor and a storage capacitor;

the thin film transistor comprises an active layer on the substrate, a gate at a side, away from the substrate, of the active layer, a first insulating layer at a side, away from the substrate, of the gate, a second insulating layer at a side, away from the substrate, of the first insulating layer, and a source and a drain which are at a side, away from the substrate, of the second insulating layer;

the storage capacitor comprises a first polar plate and a second polar plate; the first polar plate is in the same layer as the gate; the second polar plate is between the first insulating layer and the second insulating layer; and the first data signal transmission lines are in the same layer as the gate; and the second data signal transmission lines are in the same layer as the second polar plate.

20. A display device, comprising the array substrate according to claim 1.

* * * * *